(12) United States Patent
Tolpygo et al.

(10) Patent No.: US 8,437,818 B1
(45) Date of Patent: May 7, 2013

(54) SYSTEM AND METHOD FOR PROVIDING MULTI-CONDUCTIVE LAYER METALLIC INTERCONNECTS FOR SUPERCONDUCTING INTEGRATED CIRCUITS

(71) Applicant: Hypres, Inc., Elmsford, NY (US)

(72) Inventors: Sergey K. Tolpygo, Putnam Valley, NY (US); Denis Amparo, White Plains, NY (US); Richard Hunt, Park Ridge, NJ (US); John Vivalda, Poughkeepsie, NY (US); Daniel Yohannes, Stamford, CT (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 13/662,490

(22) Filed: Oct. 28, 2012

Related U.S. Application Data

(63) Continuation of application No. 12/986,720, filed on Jan. 7, 2011, now Pat. No. 8,301, 214.

(60) Provisional application No. 61/293,296, filed on Jan. 8, 2010.

(51) Int. Cl.
*H01L 23/48* (2006.01)
*H01L 27/00* (2006.01)

(52) U.S. Cl.
USPC .......................................... 505/190; 505/234

(58) Field of Classification Search ................. 505/190, 505/234, 237, 238, 239, 329, 817, 832; 365/162; 438/2
See application file for complete search history.

(56) References Cited

U.S. PATENT DOCUMENTS

| | | | |
|---|---|---|---|
| 6,999,806 B2 * | 2/2006 | Adachi et al. | 505/190 |
| 7,953,174 B2 * | 5/2011 | Asbeck et al. | 375/295 |
| 8,032,196 B2 * | 10/2011 | Wakana et al. | 505/190 |

* cited by examiner

*Primary Examiner* — Colleen Dunn
(74) *Attorney, Agent, or Firm* — Steven M. Hoffberg; Ostrolenk Faber LLP

(57) ABSTRACT

Superconducting integrated circuits require several wiring layers to distribute bias and signals across the circuit, which must cross each other both with and without contacts. All wiring lines and contacts must be fully superconducting, and in the prior art each wiring layer comprises a single metallic thin film. An alternative wiring layer is disclosed that comprises sequential layers of two or more different metals. Such a multi-metallic wiring layer may offer improved resistance to impurity diffusion, better surface passivation, and/or reduction of stress, beyond that which is attainable with a single-metallic wiring layer. The resulting process leads to improved margin and yield in an integrated circuit comprising a plurality of Josephson junctions. Several preferred embodiments are disclosed, for both planarized and non-planarized processes. These preferred and other methods may be applied to digital circuits based on Rapid Single Flux Quantum logic, and to quantum computing using Josephson junction qubits.

20 Claims, 24 Drawing Sheets

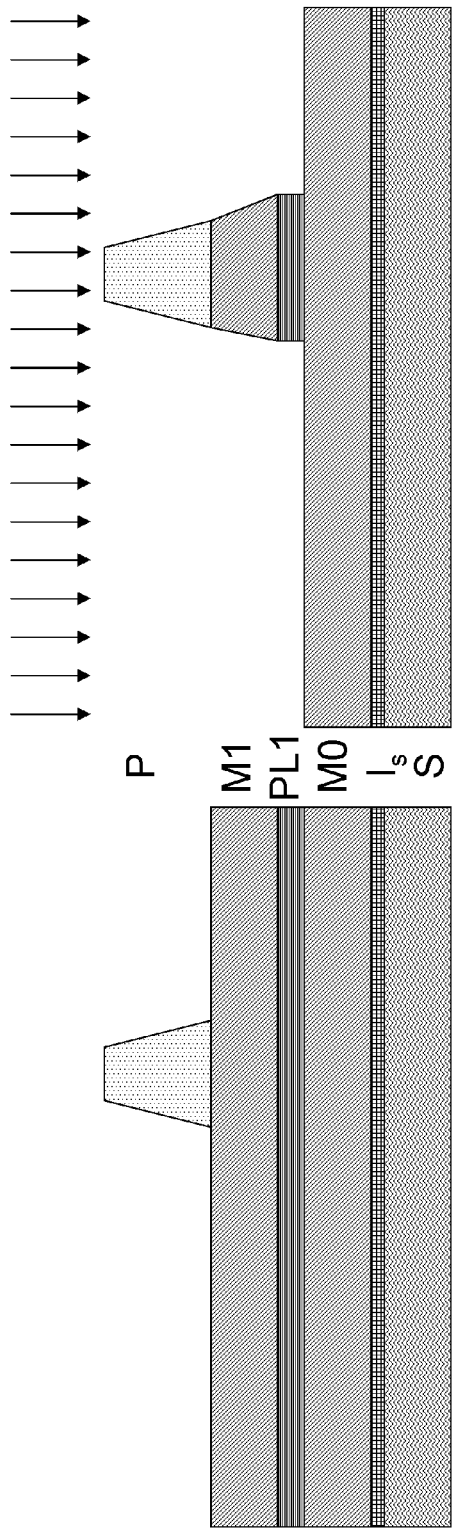
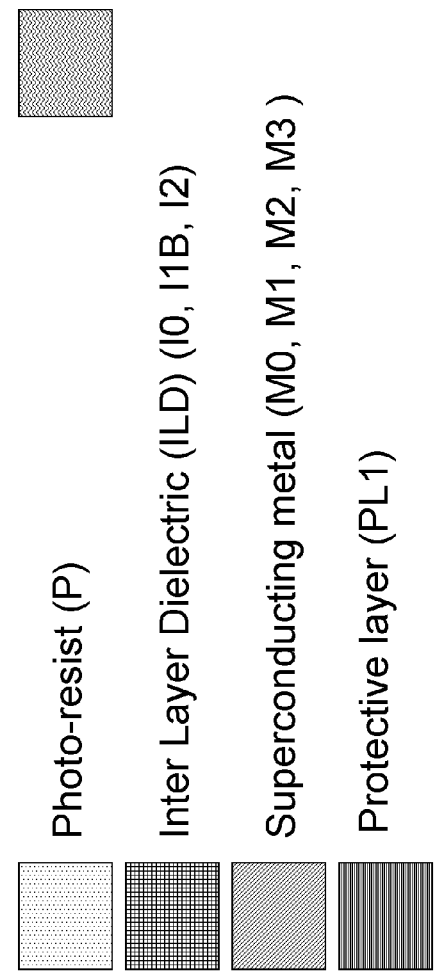
Figure 4A
Figure 4B

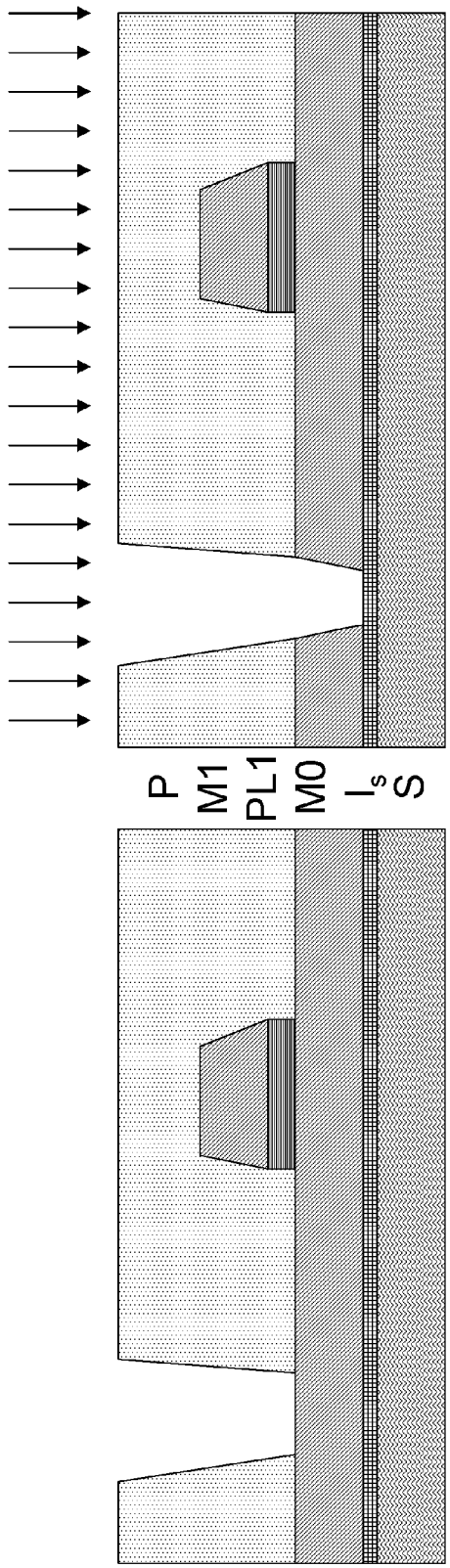

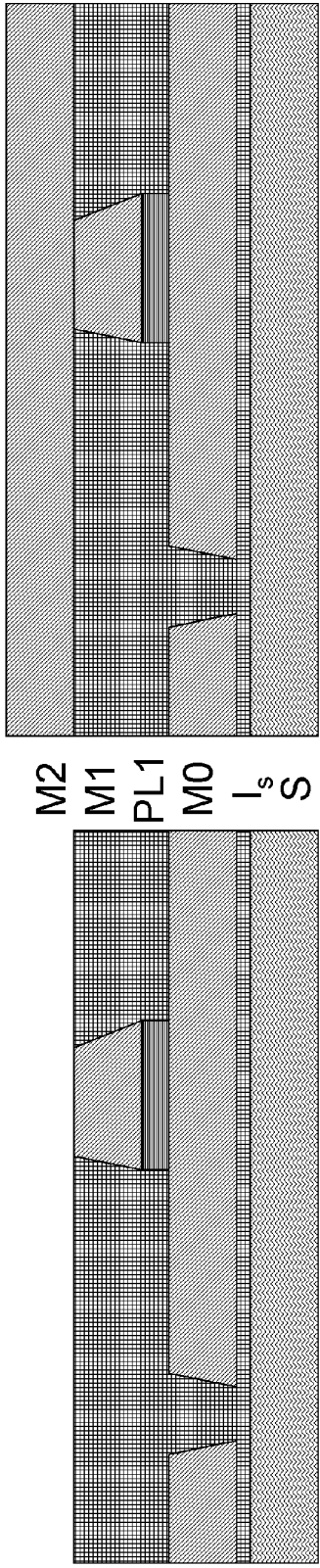
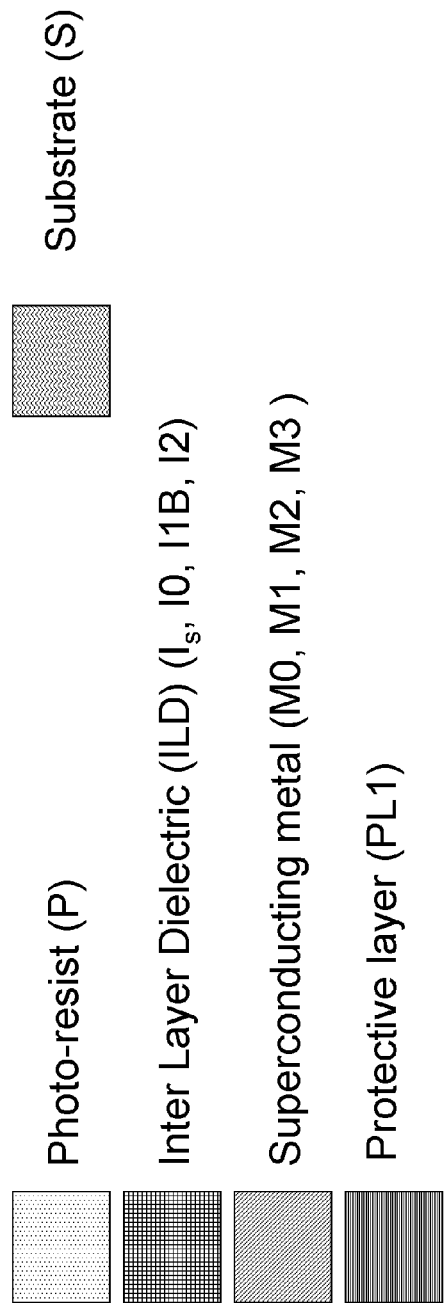
Figure 4F
Figure 4E

Photo-resist (P)

Inter Layer Dielectric (ILD) ($I_s$, I0, I1B, I2)

Superconducting metal (M0, M1, M2, M3)

Protective layer (PL1)

Substrate (S)

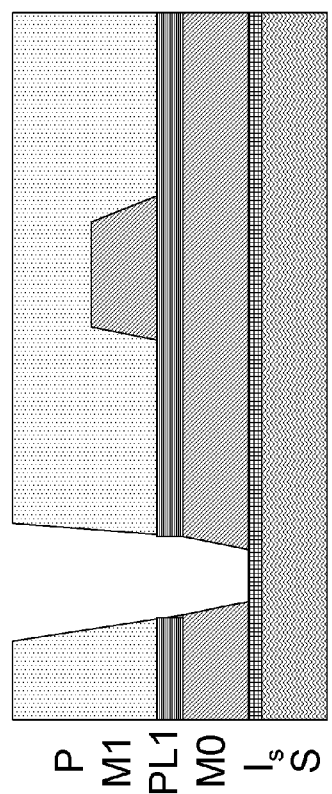
Figure 5C
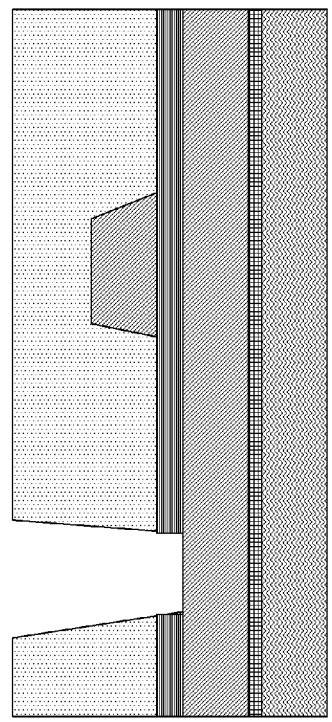
Figure 5D
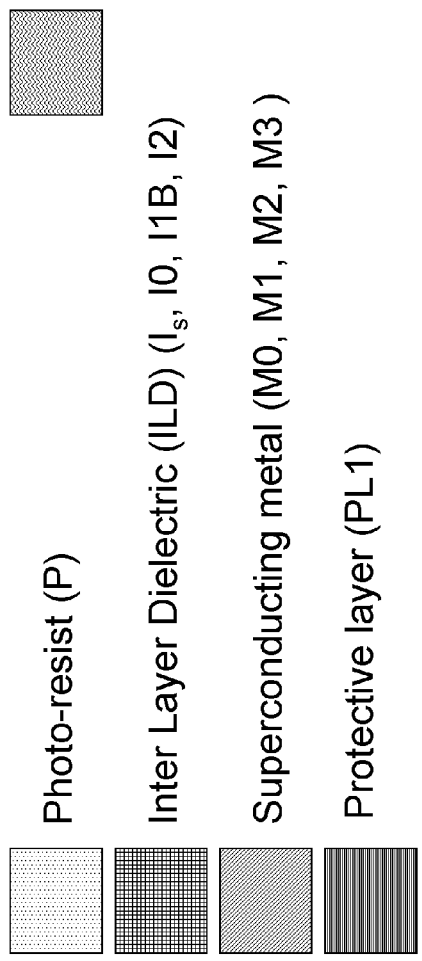

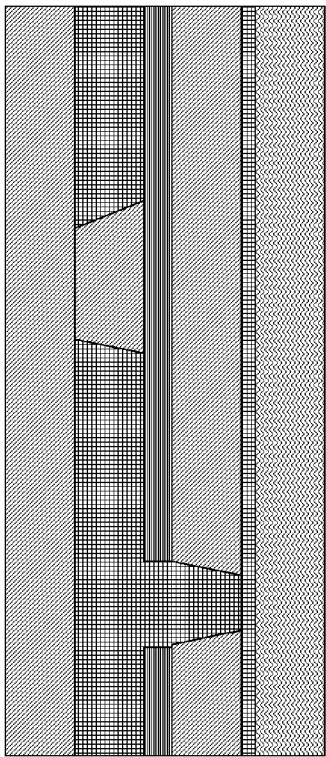
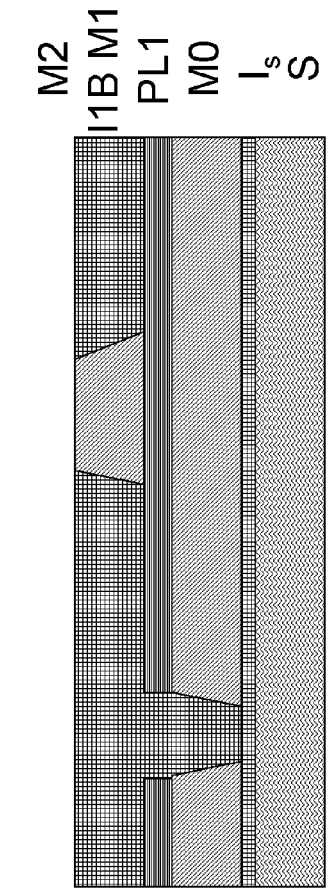
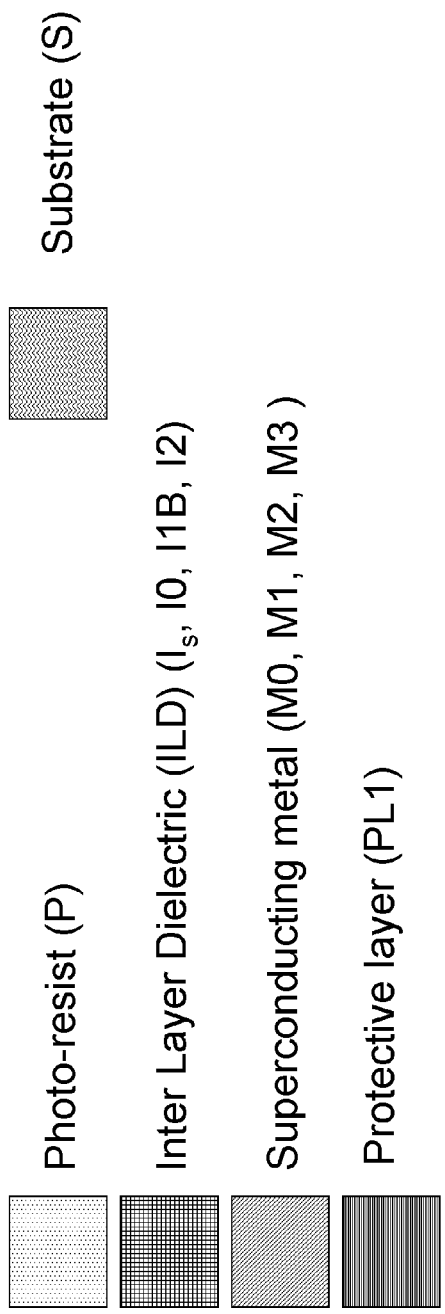
Figure 5E
Figure 5F

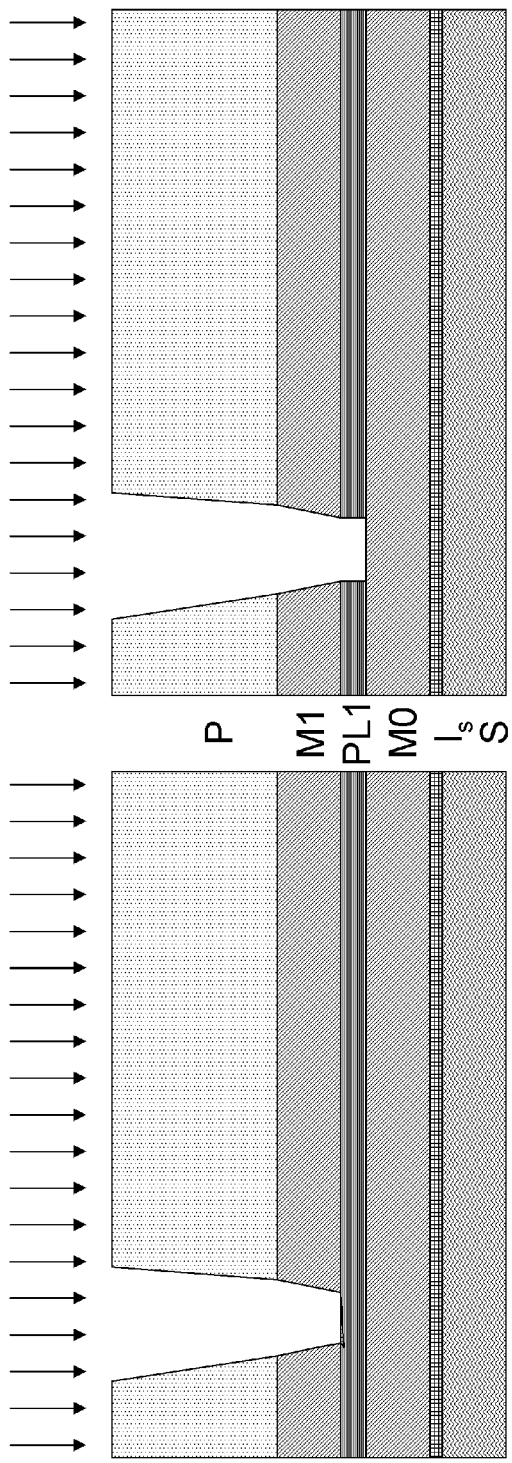

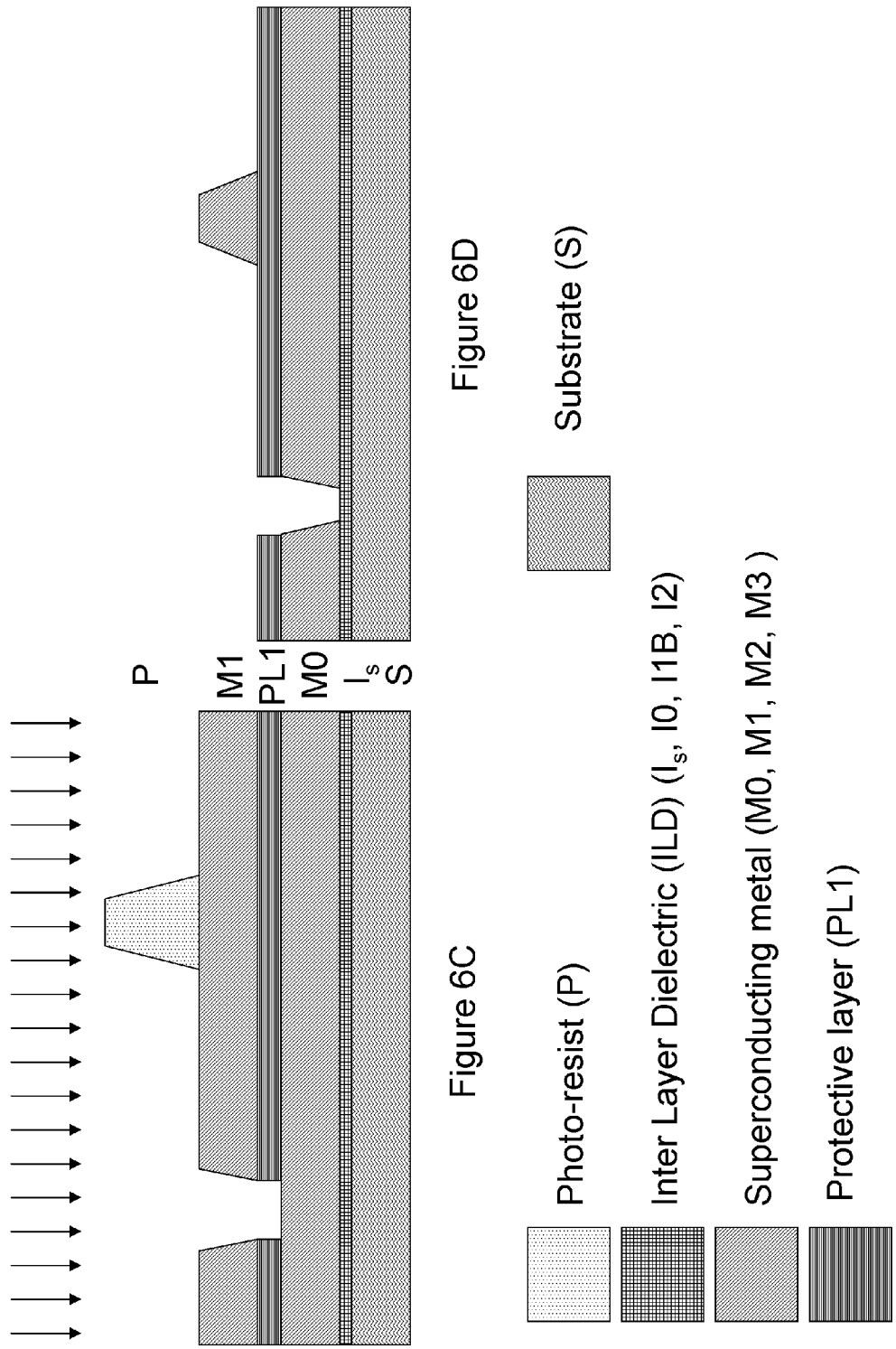

Substrate (S)

Photo-resist (P)

Inter Layer Dielectric (ILD) ($I_s$, I0, I1B, I2)

Superconducting metal (M0, M1, M2, M3)

Protective layer (PL1)

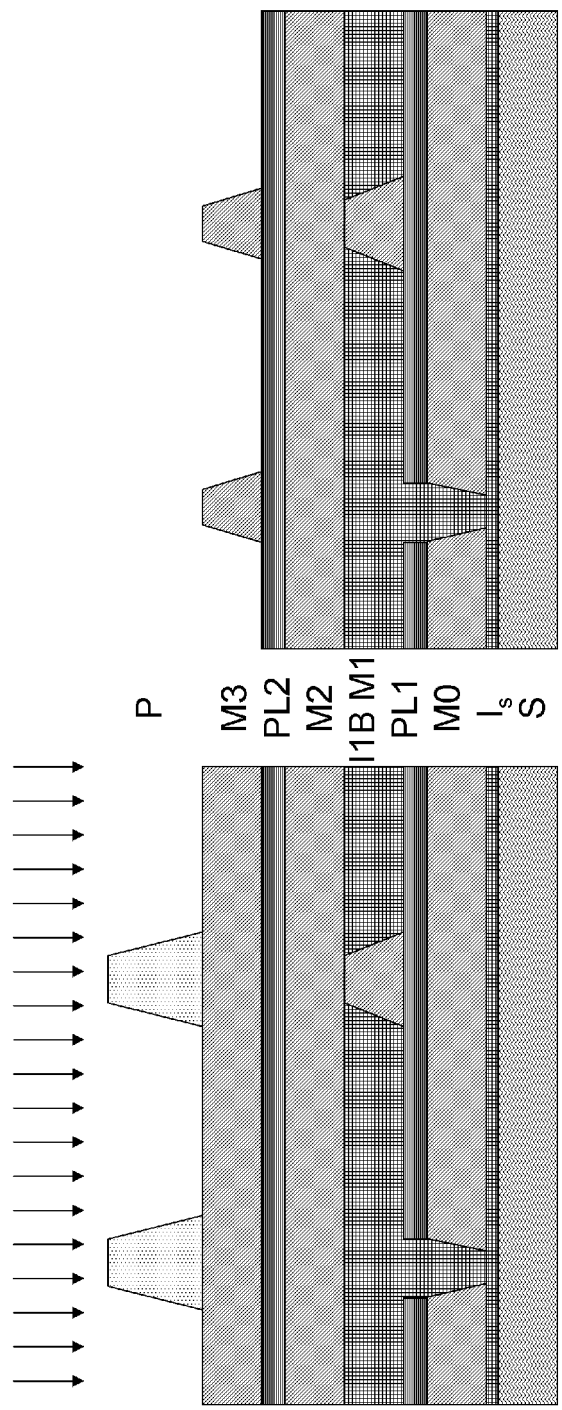

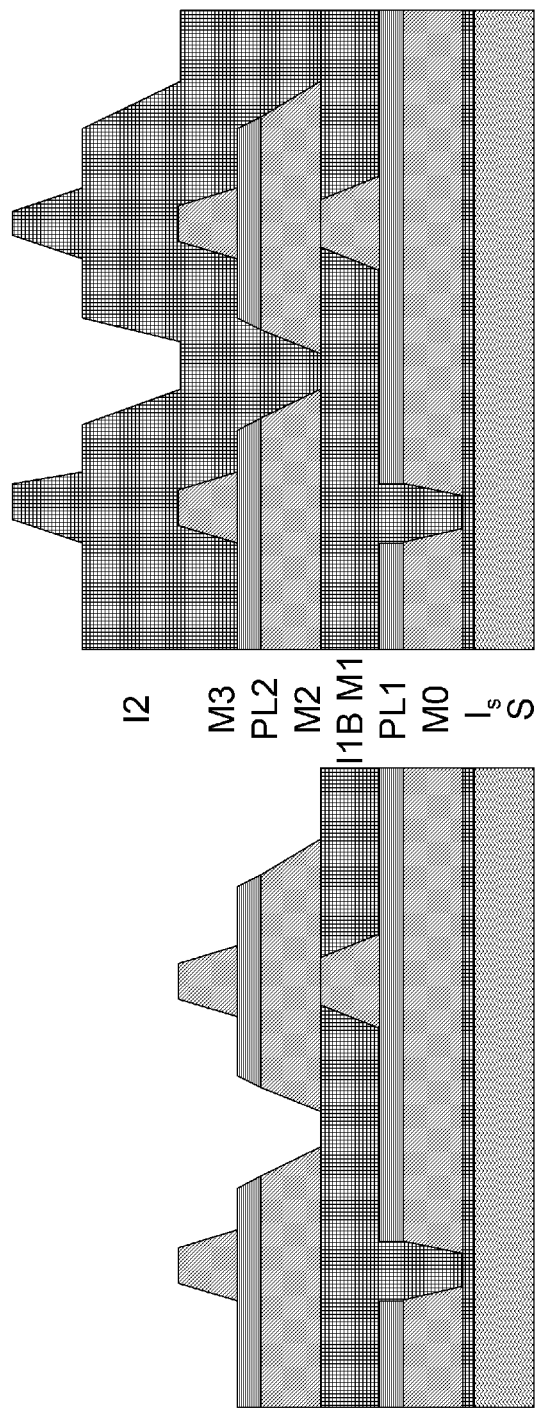

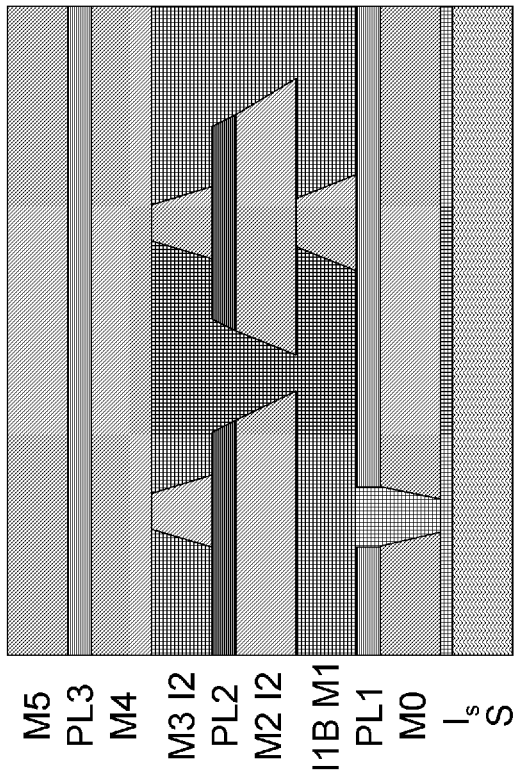
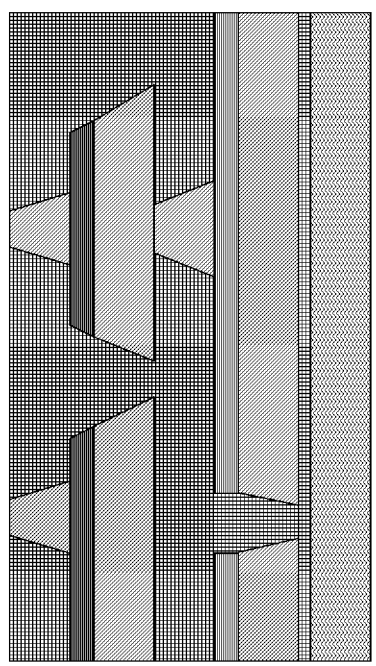
Figure 7G
Figure 7H
M5
PL3
M4
M3 I2
PL2
M2 I2
I1B M1
PL1
M0
$I_s$
S
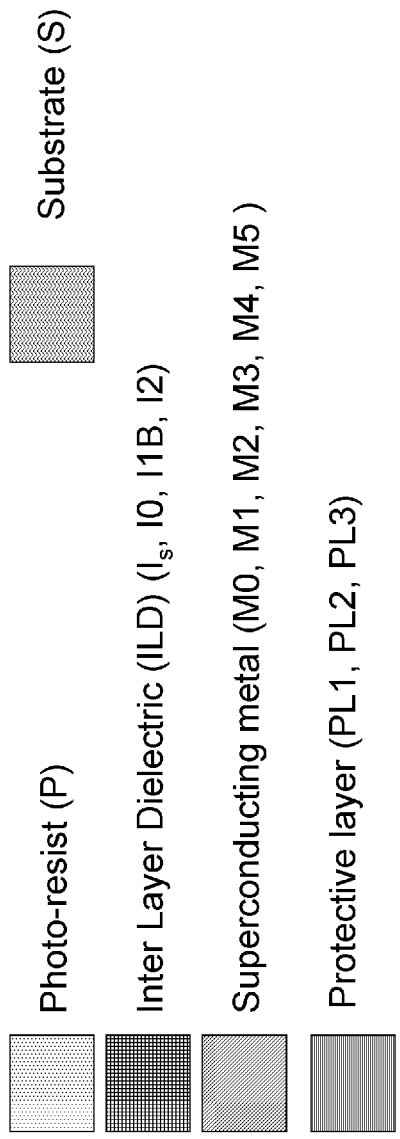
Substrate (S)
Photo-resist (P)
Inter Layer Dielectric (ILD) ($I_s$, I0, I1B, I2)
Superconducting metal (M0, M1, M2, M3, M4, M5)
Protective layer (PL1, PL2, PL3)

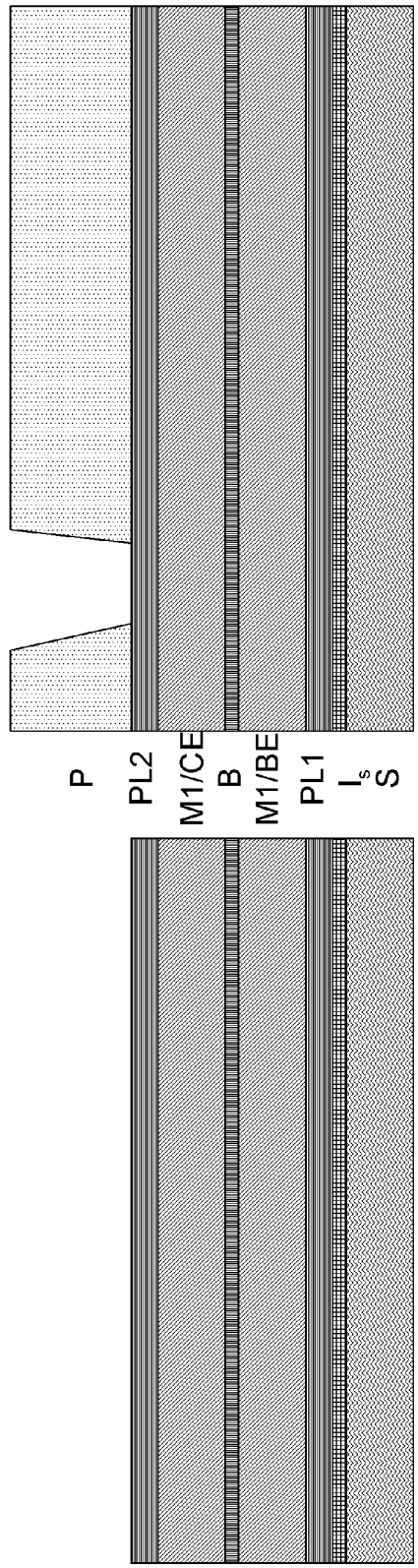
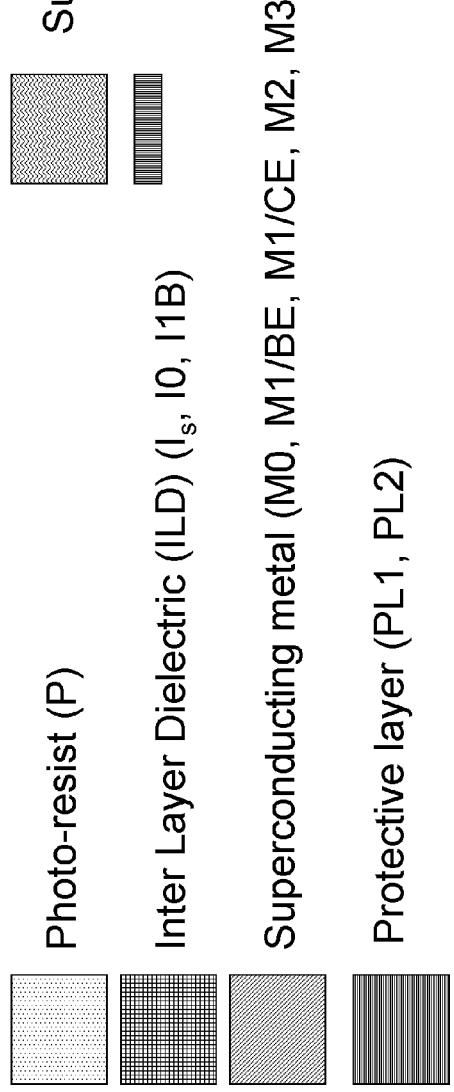
Figure 8A
Figure 8B

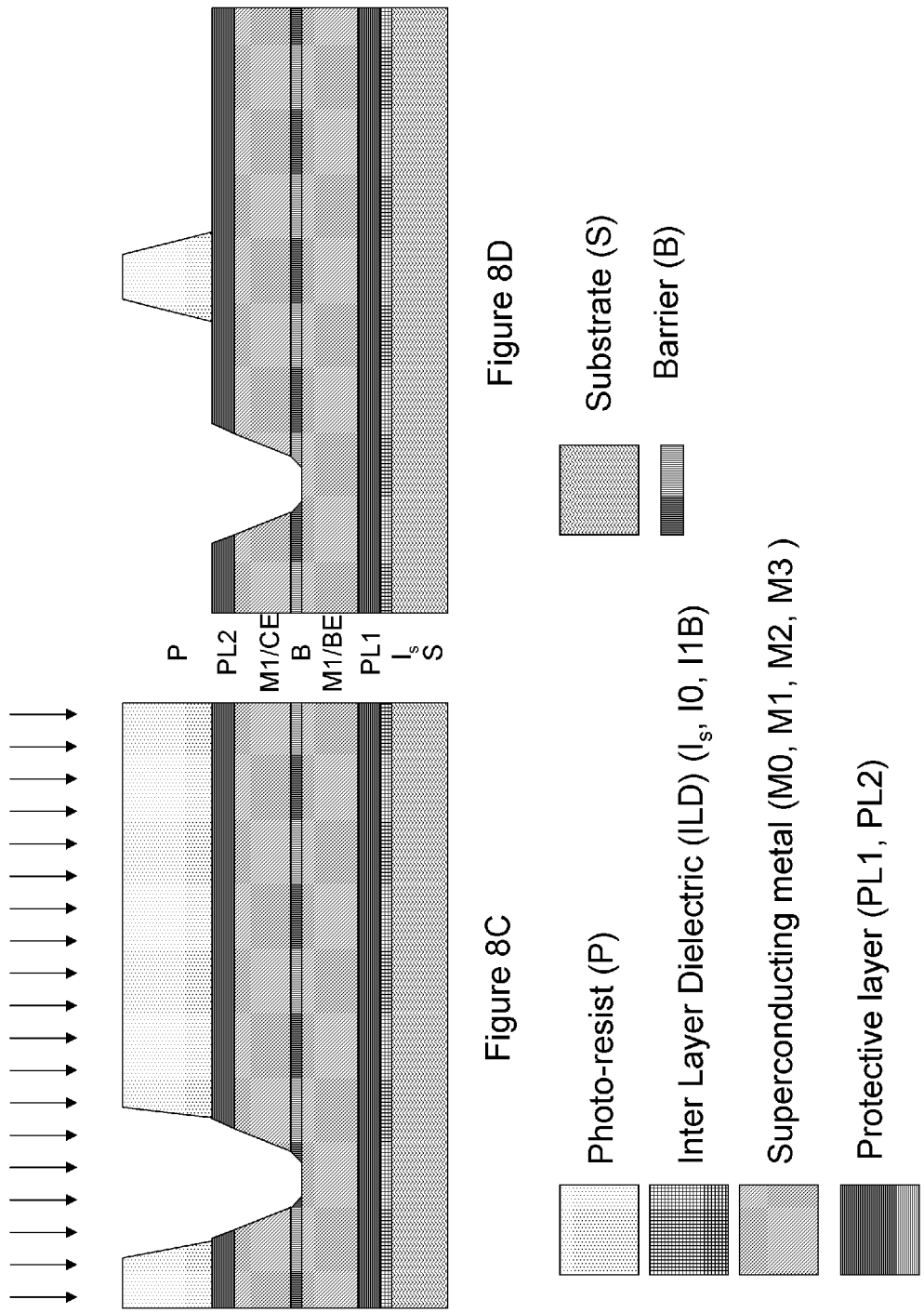

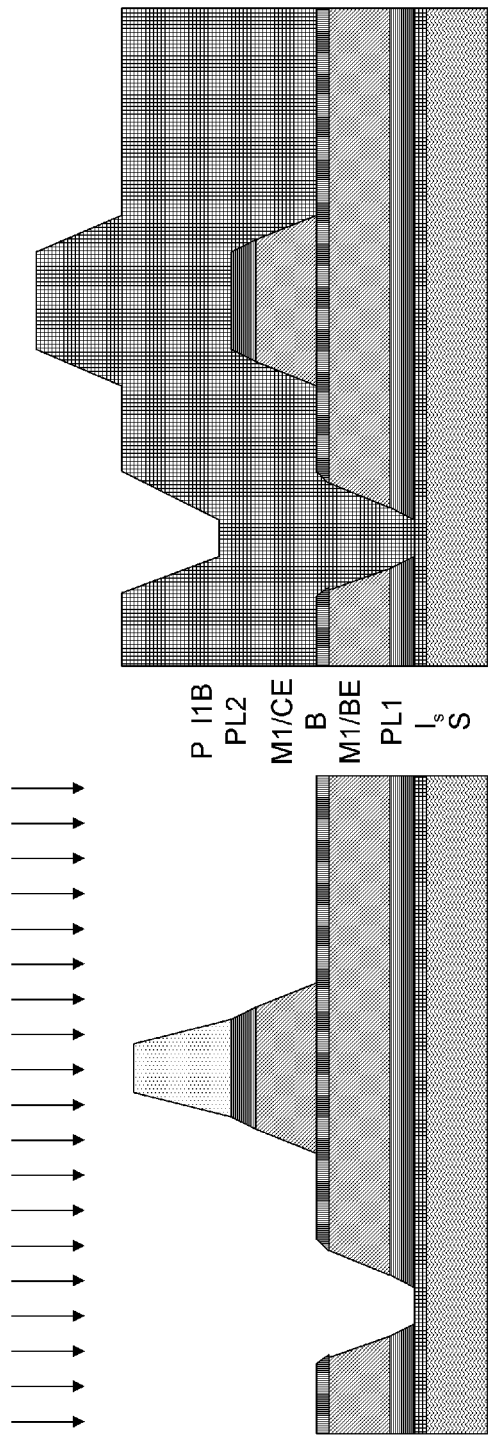
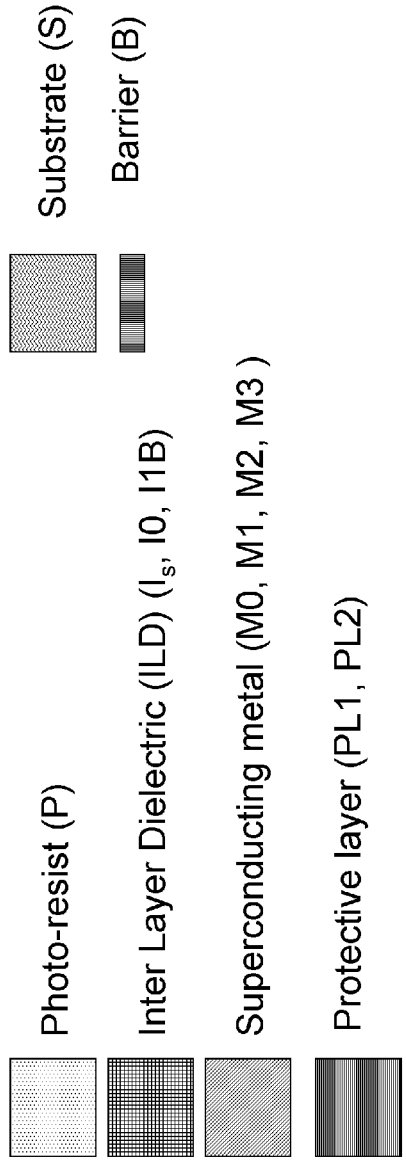
Figure 8E
Figure 8F
Substrate (S)
Barrier (B)
Photo-resist (P)
Inter Layer Dielectric (ILD) ($I_s$, I0, I1B)
Superconducting metal (M0, M1, M2, M3)
Protective layer (PL1, PL2)

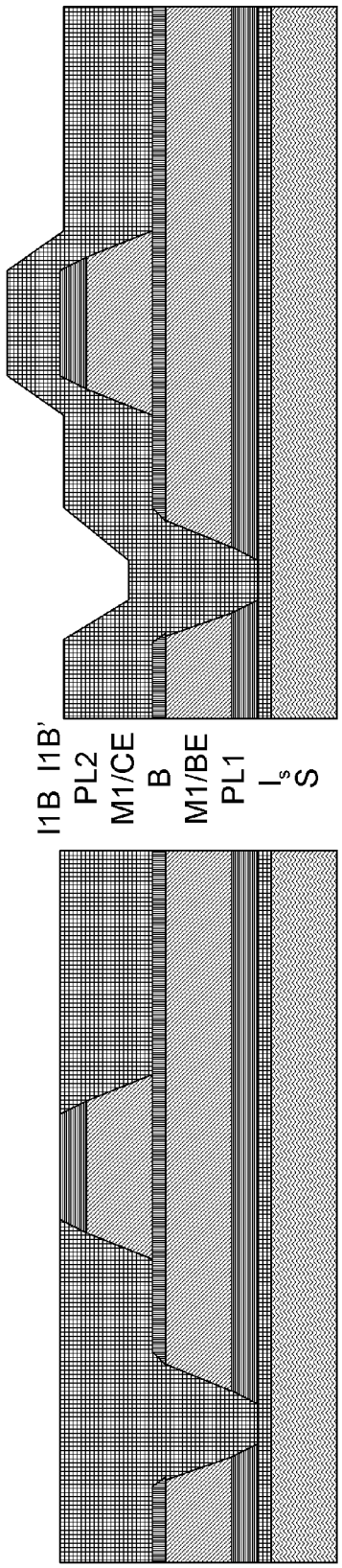

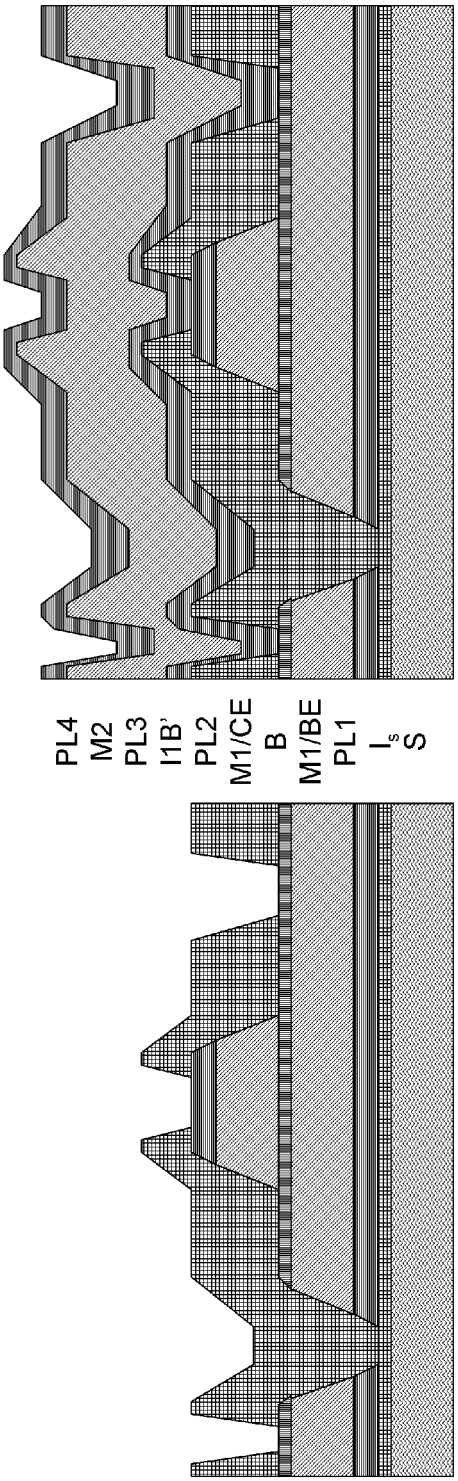
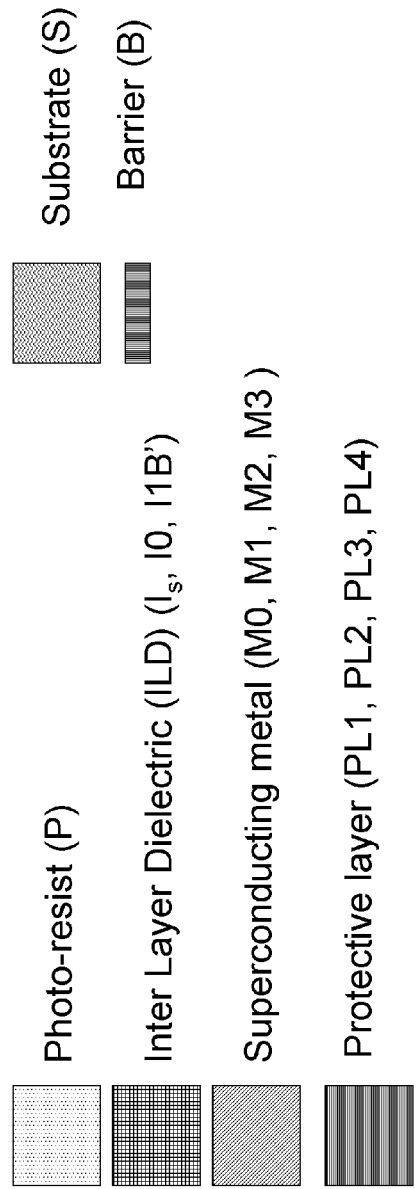
Figure 8I
Figure 8J
Photo-resist (P)
Inter Layer Dielectric (ILD) ($I_s$, I0, I1B')
Superconducting metal (M0, M1, M2, M3)
Protective layer (PL1, PL2, PL3, PL4)
Substrate (S)
Barrier (B)

US 8,437,818 B1

SYSTEM AND METHOD FOR PROVIDING MULTI-CONDUCTIVE LAYER METALLIC INTERCONNECTS FOR SUPERCONDUCTING INTEGRATED CIRCUITS

CROSS REFERENCE TO RELATED APPLICATIONS

The present application is a Continuation of U.S. patent application Ser. No. 12/986,720, filed Jan. 7, 2011, now U.S. Pat. No. 8,301,214, issued Oct. 30, 2012, which is a non-provisional of U.S. Provisional Application Ser. No. 61/293,296, filed Jan. 8, 2010, each of which is expressly incorporated herein in its entirety.

FIELD OF THE INVENTION

The present invention relates the field of fabrication techniques for superconducting integrated circuits.

BACKGROUND OF THE INVENTION

Superconductor digital integrated circuits present multi-layered structures consisting of superconducting Josephson junctions connected to resistors, inductors, capacitors, superconducting transmission lines and other circuit elements by superconducting layers separated by insulating layers. In the most common embodiments, Josephson junctions (JJ) present Nb/Al/AlO$_x$/Nb or Nb/Al/AlO$_x$/Al/Nb tunnel junctions, superconducting layers are Nb layers, and insulating layers are SiO$_2$ layers. Superconducting layers are placed both above and below the layer of Josephson junctions, and the number of layers depends on the fabrication process and circuit design. Fabrication processes containing up to 10 superconducting (Nb) layers have been described. One embodiment of the prior art is a standard Hypres IC process (Hypres Inc., Elmsford N.Y.), as shown in FIG. 1.

Superconducting Nb layers can be replaced by Nb-based alloys or compounds such as Nb—Zr, Nb—Ti, niobium nitride NbNx, niobium-titanium nitride NbTiN$_x$, niobium carbonitride NbC$_x$N$_y$, and similar. The tunnel barrier material of Josephson junctions, in addition to aluminum oxide AlO$_x$, can also be aluminum nitride AlN$_x$, magnesium oxide MgO$_x$, and other dielectrics. In some implementations, the tunnel barrier is replaced by a poorly conducting metal or a semiconductor layer such as variously doped Si, Ge, GaN, silicides of transition metals, etc. The main requirements for superconducting materials and the barrier material of Josephson junctions is that the manufactured Josephson junctions in superconductor integrated circuits should be uniform, reproducible, and stable. It is noted that an aluminum oxide tunnel barrier is typically formed such that the aluminum layer is incompletely oxidized, leaving a thin aluminum layer, since the quality of a niobium oxide layer formed under the oxidizing conditions suitable for aluminum oxidation is poor. The Josephson junction "trilayer" may therefore actually be a quad layer device.

Performance and operation margins of Rapid Single Flux Quanta (RSFQ) circuits are very sensitive to circuit parameter spreads, especially to variations in the values of critical currents of Josephson junctions comprising the circuits. Therefore, an important requirement of high-yield manufacturing technology for superconducting digital circuits is to reproducibly deliver Josephson junctions having minimal deviations of critical currents, $I_c$, from the $I_c$s required by the circuit design and optimization. The most advanced fabrication technology capable of superconducting very large scale integrated (VLSI) circuits has been Nb-based technology that utilizes Nb/Al/AlO$_x$/Nb Josephson junctions and multiple layers of Nb for circuit inductors, interconnects, and signal routing.

It has been found recently that in Nb circuits, in addition to small and random variations of critical currents of JJs, there can exist large and systematic deviations of critical currents of JJs from the expected (design) values [1]-[4]. The former are caused by statistical fluctuations in the junction area and tunnel barrier transparency, and can be characterized by a standard deviation, $\sigma I_c$. The latter means that the value of $I_c$ deviation in a specific junction or a group of junctions, though potentially varying from run to run, many times exceeds $\sigma I_c$, so the probability of this happening as a result of random fluctuations is statistically negligible. For instance, the $J_c$ in a JJ may depend on how the junction is connected to other circuit layers and on the area and shape of the contacting layers [1]-[2], whether the junction base electrode (BE) or counter electrode (CE) makes contact to Nb ground plane layer M0 [1]-[2], on the distance between the junction and the contact hole to other layers, and on the number of contact holes [3]. The critical current density and the gap voltage may increase over time in junctions stored at room temperatures if one or both of the junction electrodes are connected by Nb wire to Ti/Au or Ti/Pd/Au contact pads or just covered by a layer of Ti [4]. The effect is larger if CE is connected to a Ti-coated layer than if BE is connected.

The dependences of Josephson junction properties on the junction's environment and circuit patterns have been explained as resulting from hydrogen contamination of Nb circuit layers during wafer processing, with its subsequent migration towards or away from the AlOx tunnel barrier during the manufacturing cycle and later on upon its completion [3]-[6]. Long-term changes in $I_c$ were first found in Nb circuits with Pd coating [5], [6] and were suggested to be caused by hydrogen absorption and desorption.

It is well known that bulk Nb and Nb films can dissolve large amounts of hydrogen at room temperature, up to $c_H$~50 atomic percent, where $c_H$ is the hydrogen content (H/Nb ratio). Hydrogen is the most mobile impurity [7]. Its diffusion coefficient in Nb at 300 K is D~$10^{-5}$ cm$^2$/s; and diffusion activation energy is 0.106 eV, the lowest of all impurities (next is oxygen with the activation energy ~1 eV [8]).

Dissolved hydrogen changes many physical properties of Nb, e.g., it increases the lattice constant, resistivity, etc. (for a review, see [9]). Most importantly, it increases the work function of hydrogen-contaminated niobium, Nb(H), with respect to the clean Nb [10], [11]. As a result, the average height of the tunnel barrier in Nb/Al/AlOx/Nb junctions and the barrier asymmetry become dependent on the $c_H$ in the CE near the tunnel barrier, as was proposed in [4] (see also [6]). As was also suggested, the Nb base electrode in real Josephson junctions is coated by a thin Al layer which is only partially consumed by the oxidation forming an AlOx tunnel barrier. As a result, the tunnel barrier in Nb/Al/AlOx/Nb junctions is asymmetric (trapezoidal). The barrier height on the BE side, $\phi_{BE}$, is determined by the work function of Al, and the barrier height on CE side, $\phi_{CE}$, is determined by the work function of Nb, resulting in $\phi_{CE} > \phi_{BE}$. [12]-[14]. Therefore, the presence of hydrogen in the Nb base electrode has no effect on the tunnel barrier height and hence has much less effect on the critical current density of Josephson junctions than hydrogen dissolved in the Nb counter electrode, as was explained in [4] (see also [6] and [15]).

In addition to a reversible effect on the Nb work function, it is possible that hydrogen can chemically react with the AlOx barrier and cause irreversible changes to its properties, e.g., create states with high transmission probability. Because diffusion of dissolved hydrogen in an integrated circuit occurs on a complex network of Nb wires interconnecting multiple junctions, resistors, and inductors, all with different diffusion coefficients and cross sections, complex concentration distributions may appear and depend on details of a particular circuit design. This can affect different circuits in a different, though always negative, and quite reproducible manner.

Theoretically, $H_2$ concentration in air at atmospheric pressure is sufficient to saturate Nb with hydrogen at room temperature. The Nb surface presents a potential barrier for $H_2$ molecules and the native oxide on the surface works as a diffusion barrier, and both prevent hydrogen absorption. However, in all situations when the surface oxide is removed, hydrogen can easily dissolve in Nb. Hydrogen contamination can also occur because of the reaction with water molecules (in water, aqueous solutions, and moist air)

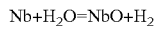
$Nb+H_2O=NbO+H_2$ and due to a charge transfer process on a clean Nb surface

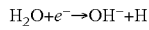
$H_2O+e^- \rightarrow OH^- + H$ forming highly active atomic hydrogen which easily dissolves in Nb. Processes such as chemical etching, reactive ion (plasma) etching, chemical mechanical polishing (CMP), ion milling of Nb remove surface oxide and, hence, can produce hydrogen contamination. During Nb film deposition by sputtering or other methods, hydrogen contamination can easily occur if there is sufficient residual hydrogen or water pressure in the vacuum chamber. After the deposition, hydrogen contamination is possible upon removing the deposited Nb film from the vacuum chamber because the clean surface of a freshly deposited film can readily react with air moisture.

The spatial variation (spread) of the physical parameters of Josephson junctions over the chip area and wafer area, such as the Josephson critical current density $J_c$, critical current of the junctions $I_c$, normal state conductance $G_n$, superconducting energy gap, subgap conductance and leakage current, and their physical dimensions can thus be non-uniform. The manufacturing yield of superconducting integrated circuits decreases strongly with increasing the on-chip and on-wafer spreads of parameters of Josephson junctions.

Reproducibility characterizes the ability of the manufacturing process to reproduce the same parameters of Josephson junctions from wafer to wafer and run to run. High-yield manufacturing requires high reproducibility of parameters of Josephson junctions.

Long-term stability of parameters of Josephson junctions is required for implementations of superconductor circuits in electronic devices and systems as well as their stability against thermal cycling between the temperature of their operation (usually around 4.2 K) and the temperature of their storage at room or slightly elevated temperatures, typically in the range from 290 K to 350 K.

One of the most important factors determining the manufacturing yield of superconductor integrated circuits based on Josephson junctions is deviations of the critical current of manufactured Josephson junctions from the proper (target) values dictated by the circuit design. Usually, deviations of $I_c$ of just a few junctions by more than about ±10% from their target values can make digital circuits based on Rapid Single Flux Quantum (RSFQ) logic with about $10^4$ of Josephson junctions completely non-operational. Yet smaller deviations become critical as the number of Josephson junctions in the circuit increases further. The critical current of a Josephson tunnel junction in general depends on the superconducting energy gaps in the junction electrodes and on the transparency of the tunnel barrier. The barrier transparency in turn depends on the tunnel barrier height, thickness, and the amount defects in the barrier which locally alter the average transparency. There are two types of deviations—small random deviations and systematic deviations.

Nb, Ti, Pd, and many other transition metals and their alloys which are used in manufacturing of superconductor integrated circuits can dissolve (absorb) many gaseous impurities, especially hydrogen, during many steps of wafer processing such as thin film deposition, dry etching using reactive plasmas, chemical etching, chemical mechanical polishing, ion milling, etc. Since different layers in the multilayered structure of the integrated circuit may undergo a different number of processing steps, the concentration of absorbed impurities (e.g., hydrogen) may be different in different layers. Different superconducting layers, Josephson junctions, resistors, and inductors in integrated circuits are connected to each other using contact holes, vias, and plugs, to form an integrated circuit. These connections create a complicated network of passages along which diffusion of impurities (e.g., of hydrogen) may occur during the wafer fabrication and later during the storage of manufactured circuits. Hydrogen is known to have a high diffusion coefficient (mobility) in Nb, Ta, Ti, Pd and many other transition metals and alloys at room temperature typical of wafer storage and slightly elevated temperatures which may be used for some of the wafer manufacturing steps. The wafer temperature during plasma enhanced chemical vapor deposition of silicon dioxide ($SiO_2$) can be as high as 500 K.

As a result of interlayer diffusion, a distribution of impurities appears around electrodes of Josephson junctions, which depend on the circuit patterns. The distribution is dependent on how particular junctions are connected to other metal layers and circuit elements, on the distance between junctions and contacts between different layers, on the area of metal layers to which a particular junction is connected to, and so on. Since the critical current of Josephson junctions depends on the concentration of impurities in the electrodes, the critical current of Josephson junctions in integrated circuits also become dependent on the circuit pattern, the way a particular junction is connected (wired) to other circuit elements, the area and type of metal layers to which the connection is made, etc. For instance, it has been shown that the critical current of Josephson junctions connected by their base electrode to a ground plane Nb layer can be substantially larger that the critical current of otherwise identical junctions which are not connected directly to the ground plane. The difference was found to depend on the area of the ground plane and on the distance between the junction and the contact hole to the ground plane. It was also found that junctions which are connected by superconducting (Nb) wires to Ti/Pd/Au or Ti/Au metallization on the input/output contact pads also have higher critical currents that the otherwise identical junctions but not connected directly to the same Ti/Pd/Au or Ti/Au contact pads. (In this case connections can be made through additional Josephson junctions in series with the junction under investigation or by interrupting a direct connection by Nb wire with some other material, e.g. Mo.)

A significant drawback of the existing practice is that the critical current of Josephson junctions in superconductor integrated circuits may depend on the circuit patterns, on the type of metal layer to which a particular junction is connected, on the area of circuit element the connection is made to (e.g., on the area of the circuit ground plane). The critical current of a Josephson junction may also depend on which electrode (base electrode or counter electrode of the junction) makes a connection to the circuit ground plane. It may also depend on the presence of contact holes (vias, plugs) to other circuit layers in the proximity of the junction. It may also depend on how the junction is connected to input/output contact pads, which are usually covered by Ti/Pd/Au or T/Au metallization, e.g. on the length of the connecting wire or the type of metal or if the wiring is interrupted by a resistor on not.

All the mentioned above and similar pattern-dependent effects on properties of Nb-based Josephson junctions significantly reduce the manufacturing yield of superconductor integrated circuits. In general, any deviations of critical current of Josephson junctions in digital integrated circuits from the design values reduce the margin of operation and the maximum clock frequency, and hence the circuit yield.

SUMMARY OF THE INVENTION

According to one aspect of the present invention, extra conductive, i.e., metallic layers, are added, which are placed on the surfaces of superconducting layers forming integrated circuits. These additional layers reduce or prevent diffusion of impurities (mainly of hydrogen) dissolved in various layers of superconductor integrated circuits, or act to selectively absorb the impurities, and act as a sink or getter, to in either case prevent the impurities from contaminating or adversely affecting the superconducting layers forming Josephson junctions. As noted above, in many cases, it is uncompensated non-uniformity that presents a problem, and not the presence of hydrogen per se, and therefore the layer may be provided in such fashion to decrease the uncompensated non-uniformity of the hydrogen or other impurity profile. The conductive layer materials and parameters are selected such that under the circuit operating conditions (i.e., temperature, proximity to other superconducting materials, etc.), the conductive layer itself becomes superconductive, and thus does not interfere with circuit operation. Insulating materials are typically unsuited, since they cannot simultaneously meet all of the requirements of electrical and physical properties. However, in some cases, the diffusion-stop layer or impurity-absorptive layer may be insulating. Likewise, the thickness of a conductive layer is typically limited by the range of proximity superconduction from the underlying (or overlying) native superconductor, e.g., niobium. Therefore, the layer should preferably meet the following criteria: (a) electrical properties sufficient to ensure integrated circuit functionality similar to the nominal functionality in the absence of the layer; (b) protective properties to achieve enhanced uniformity of devices at different locations on the die.

It is therefore an object to provide a superconducting integrated circuit comprising at least two Josephson junctions and at least one interconnect adapted to operate at a superconducting temperature, wherein the at least one interconnect comprises at least two adjacent conductive layers formed from different materials having respectively different critical superconducting temperatures and different gas permeability, or gas partition coefficient, or one layer acts as a getter, wherein respective portions of a superconducting current are transmitted between the at least two Josephson junctions when cooled to the superconducting temperature via each of the at least two conductive layers of the interconnect.

It is a further object to provide a superconducting Josephson junction comprising a first metal layer, a first superconducting layer disposed on top of the metal layer, a junction barrier layer disposed on top of the first superconducting layer, a second superconducting layer disposed on top of the junction barrier layer, and a second metal layer on top of the second superconducting layer, wherein the first metal layer and the second metal layer exhibit induced superconductivity at cryogenic temperatures due to proximity to the first and second superconducting layers respectively, and the first and second metal layers have a respectively lower hydrogen permeability or higher absorptivity or higher reactiveness than the first and second superconducting layers.

It is a still further object to provide a superconducting integrated circuit comprising at least two superconducting layers and at least two Josephson junctions each having a barrier sensitive to contamination, the improvement comprising providing an induced superconductivity layer adjacent to each of the at least two superconducting layers which substantially reduces hydrogen concentration and/or variations in hydrogen concentration in the at least two superconducting layers.

It is also an object to provide a quantum computing element, comprising at least one contamination-sensitive Josephson junction having a Josephson junction trilayer, and a metal layer adjacent to the Josephson junction trilayer comprising a metal displaying induced superconductivity at an operating temperature of the Josephson junction and a lower hydrogen permeability or a higher hydrogen absorptivity or reactivity than a superconducting material forming the Josephson junction.

Another object provides a method of forming a superconducting integrated circuit, comprising depositing a Josephson junction trilayer comprising two superconducting metal layers separated by a barrier junction layer, and deposing adjacent at least one of the superconducting metal layers a metal which displays induced superconductivity at an operating temperature of the Josephson junction and which is substantially less permeable, more absorptive or more reactive to hydrogen than the superconducting metal layers.

It is a further object to provide a superconducting integrated circuit configured to dynamically switch at a superconducting temperature, comprising: a first superconducting layer; a second superconducting layer; a protective layer adjacent to portions of the first superconducting layer and the second superconducting layer, formed of a material having different chemical characteristics from each of the first and second superconducting layers, the protective layer being produced by a process which forms the protective layer adjacent to an unpatterned surface of one of the first and second superconducting layers which is then patterned together with the protective layer, the protective layer being superconductive, or induced into superconductivity by proximity to the first and second superconducting layers, wherein over the range of normal operation of the superconducting integrated circuit, the protective layer conducts a current between the first and second superconducting layers without switching.

It is a still further object to provide a method of forming a superconducting integrated circuit, comprising: depositing a first superconducting layer; depositing a protective layer on the first superconducting layer; depositing a second superconducting layer; concurrently patterning at least one of: (a) the protective layer deposited on the unpatterned first superconducting layer, or (b) the second superconducting layer deposited on the unpatterned protective layer, the protective layer being formed from a material having different chemical characteristics from each of the first and second superconducting layers, and being superconductive, or induced into superconductivity by proximity to at least one of the first and second superconducting layers at an operating temperature of the integrated circuit and wherein over a temperature range of normal operation of the superconducting integrated circuit, the protective layer being configured to conduct a current between the first and second superconducting layers without switching, and an active junction of the superconducting integrated circuit being configured separate from the protective layer, to dynamically switch at the temperature range of normal operation of the superconducting integrated circuit.

It is also an object of provide a method of operating a superconducting integrated circuit, comprising: cooling the integrated superconducting integrated circuit to a temperature below 50K, the superconducting integrated circuit comprising at least one portion having a trilayer consisting of a first superconducting layer, a protective layer, and a second superconducting layer, wherein the protective layer is deposited on the first superconducting layer before concurrent patterning of the first superconducting layer and the protective layer, or the second superconducting layer is deposited on the protective layer before concurrent patterning of the second superconducting layer and the protective layer, the protective layer being formed from a material having different chemical characteristics from each of the first and second superconducting layers, and being superconductive, or induced into superconductivity by proximity to at least one of the first and second superconducting layers at an operating temperature of the integrated circuit; operating the superconducting integrated circuit at a cryogenic operating temperature, during which the protective layer conducts a current between the first and second superconducting layers without switching, and operating an active Josephson junction of the superconducting integrated circuit, separate from the protective layer, to dynamically switch at the cryogenic operating temperature.

A further object provides a Josephson junction comprising a junction barrier layer sandwiched between two superconducting layers, whereby at least one protective layer is in contact with at least one of the superconducting layers, and whereby the at least one protective layer acts to decrease a density of defects in the Josephson junction due to impurities diffusible in at least one of the superconducting layers at room temperature.

The superconducting layer, second superconducting layer, and protective layer typically have critical temperatures below 50K.

The protective layer may acts to substantially block diffusion of impurities between the first superconducting layer and the second superconducting layer; acts to absorb impurities to reduce transmission of impurities between the first superconducting layer and the second superconducting layer; reacts with impurities to reduce transmission of impurities between the first superconducting layer and the second superconducting layer; acts to as an etch stop layer to protect the first superconducting layer during etching of the second superconducting layer; and/or acts to as an etch stop layer to protect the first superconducting layer during etching of a material deposited over the protective layer distinct from the second superconducting layer.

The protective layer may have a different permeability, solubility, or reactivity for a diffusible composition, whereby a junction characteristic of a Josephson junction formed with at least one of the first superconducting layer and the second superconducting layer is stabilized with respect to variations in temperature and time by migration of the diffusible composition. The diffusible composition comprises, for example, hydrogen and/or oxygen.

The superconducting integrated circuit may further comprise at least two Josephson junctions, each having a barrier sensitive to a diffusible contaminant, wherein the protective layer substantially impedes a diffusion of the diffusible contaminant from a superconducting layer, through the protective layer, to the barrier.

The superconducting integrated circuit may be configured to provide at least one quantum computing element comprising at least one contamination-sensitive Josephson junction having a Josephson junction trilayer comprising at least one of the first and second superconducting layers, the protective layer comprising a metal layer adjacent to the Josephson junction trilayer displaying induced superconductivity at an operating temperature of the Josephson junction and a lower permeability for at least one type of contamination than a superconducting material forming the Josephson junction.

The superconducting integrated circuit may comprise at least one contamination-sensitive Josephson junction trilayer, the protective layer comprising an electrically conductive layer adjacent to a superconducting layer of the Josephson junction trilayer comprising one of the first and second superconducting layers, the protective layer having a lower permeability for at least one type of contamination than the adjacent superconducting layer of the Josephson junction.

At least one of the first and second superconducting layers may be part of a Josephson junction trilayer comprising two superconducting metal layers separated by a barrier junction layer, further comprising planarizing the superconducting integrated circuit after at least one patterning step.

The protective layer may serve to relieve a stress in at least one of the first and second superconducting layers.

The superconducting layer, second superconducting layer, and protective layer may have critical temperatures below 50K.

The protective layer may substantially block diffusion of impurities between the first superconducting layer and the second superconducting layer; absorb of impurities from at least one of the first superconducting layer and the second superconducting layer; react with impurities from at least one of the first superconducting layer and the second superconducting layer, while maintaining a superconductivity or induced superconductivity of the protective layer; act as an etch stop layer during the concurrent patterning, to protect the first superconducting layer during etching of the second superconducting layer; and/or act as an etch stop layer during the concurrent patterning, to protect the first superconducting layer during etching of a material deposited over the protective layer distinct from the second superconducting layer.

The protective layer may have a different permeability, solubility, or reactivity for a diffusible composition, whereby a junction characteristic of a Josephson junction formed with at least one of the first superconducting layer and the second superconducting layer is stabilized with respect to variations in temperature and time by migration of the diffusible composition.

The protective layer may have a respectively a lower diffusion coefficient or higher affinity for at least one mobile phase than first or second superconducting layers. The mobile phase may comprise hydrogen, and the protective layer may have a lower diffusion coefficient for hydrogen than the first and second superconducting layers.

These and other objects will become apparent through a review of the drawings and detailed description of the preferred embodiments.

BRIEF SUMMARY OF THE FIGURES

FIGS. 4A to 4F show steps of superconducting plug formation in a planarized IC process.

FIGS. 5A to 5F show steps of an alternative superconducting plug formation process with surface protection layer in a planarized IC process.

FIGS. 6A to 6F show steps of an inverted process of superconducting plug formation using a trilayer.

FIGS. 7A to 7H shows process steps extending the trilayer process of FIGS. 6A-6F to a second superconducting wiring layer.

FIGS. 8A to 8J show process steps for forming a quantum computing cell (qubit) in a planarized and nonplanarized process.

DETAILED DESCRIPTION OF THE PREFERRED EMBODIMENTS

Figure 1:
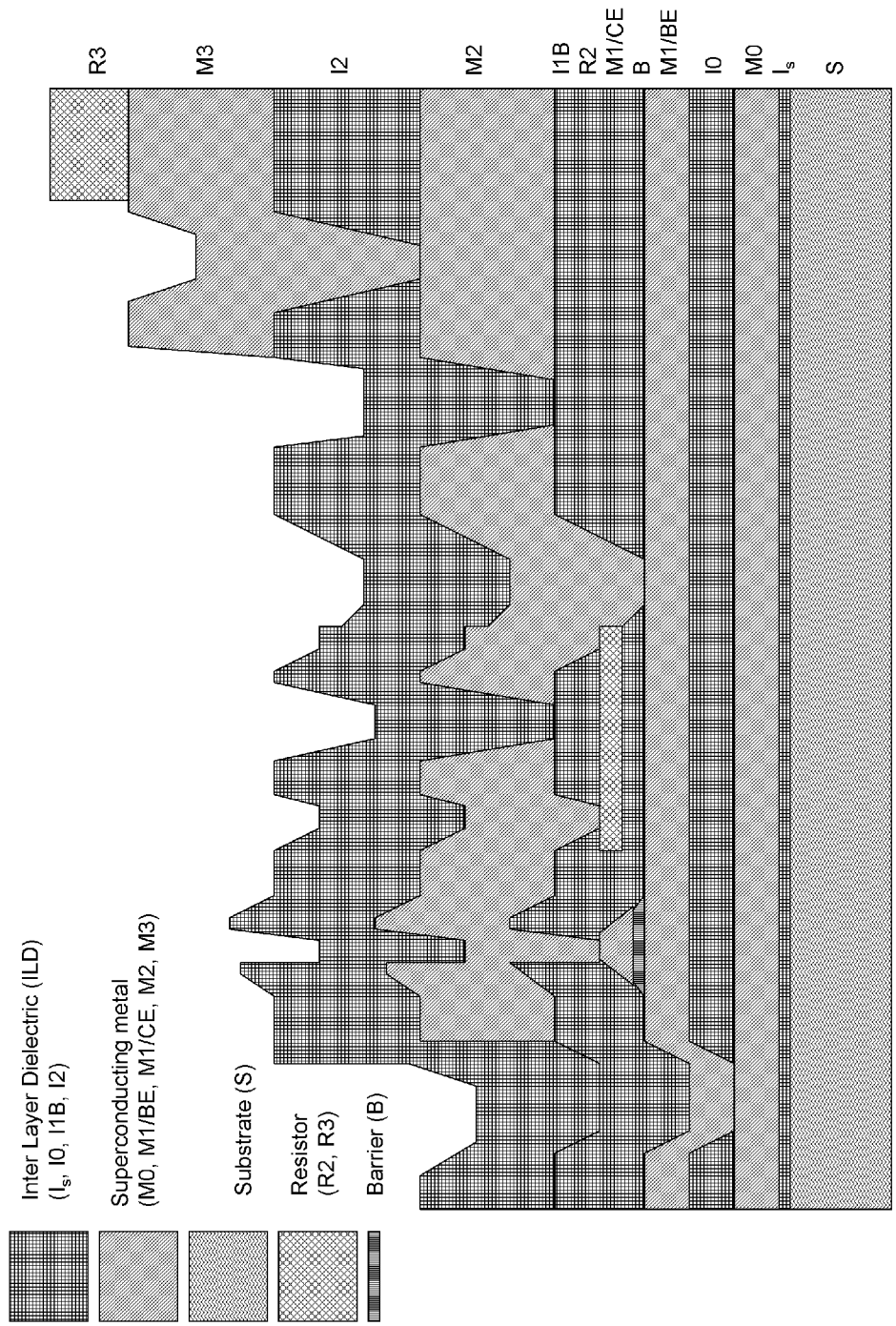
FIG. 1 shows a cross section of a superconducting integrated circuit produced according to a prior art process.
Figure 2A:
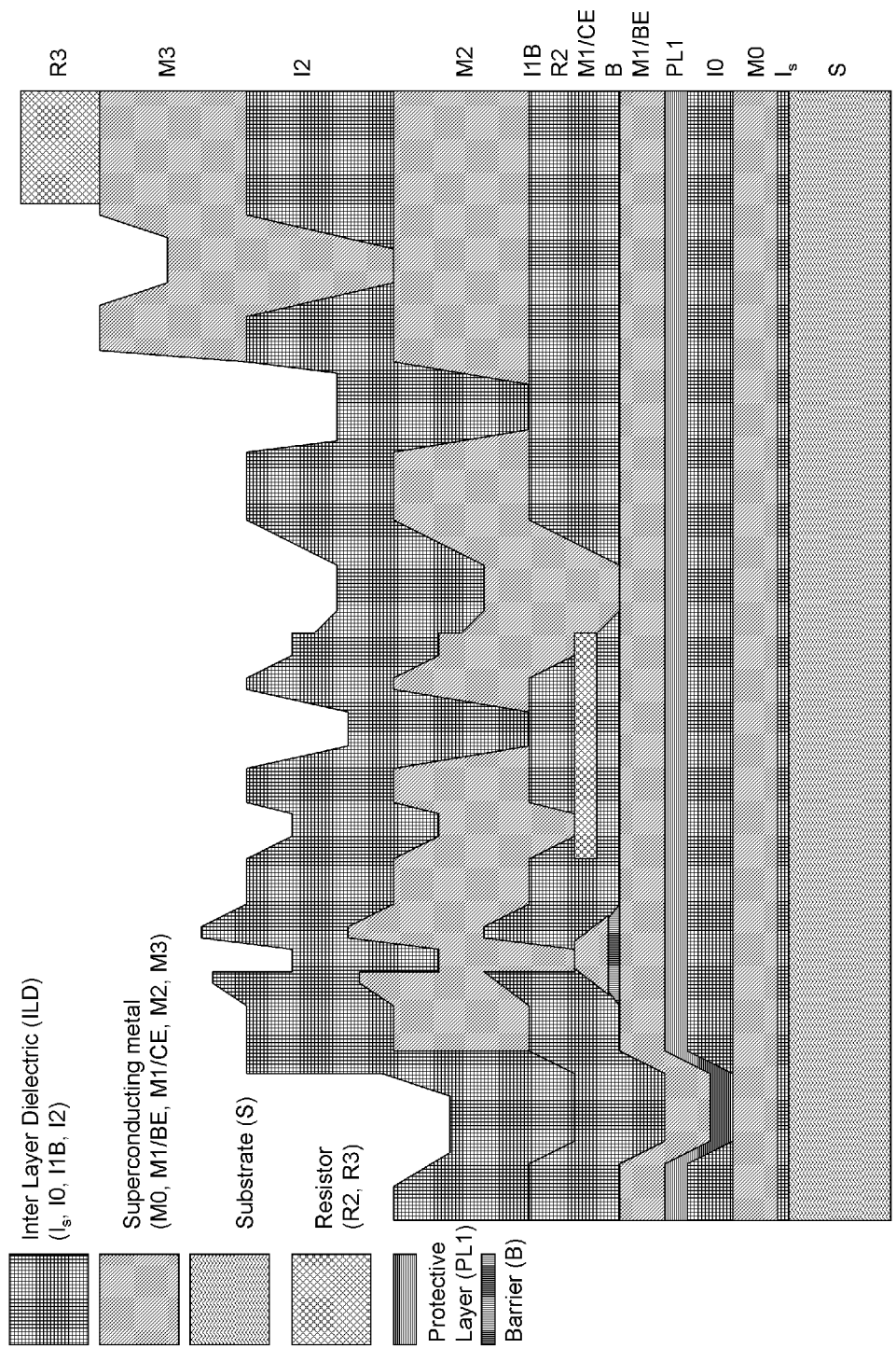
FIGS. 2A-2D show aspects of a modification of the process shown in FIG. 1, which includes one or more protective layers.
Figure 2B:
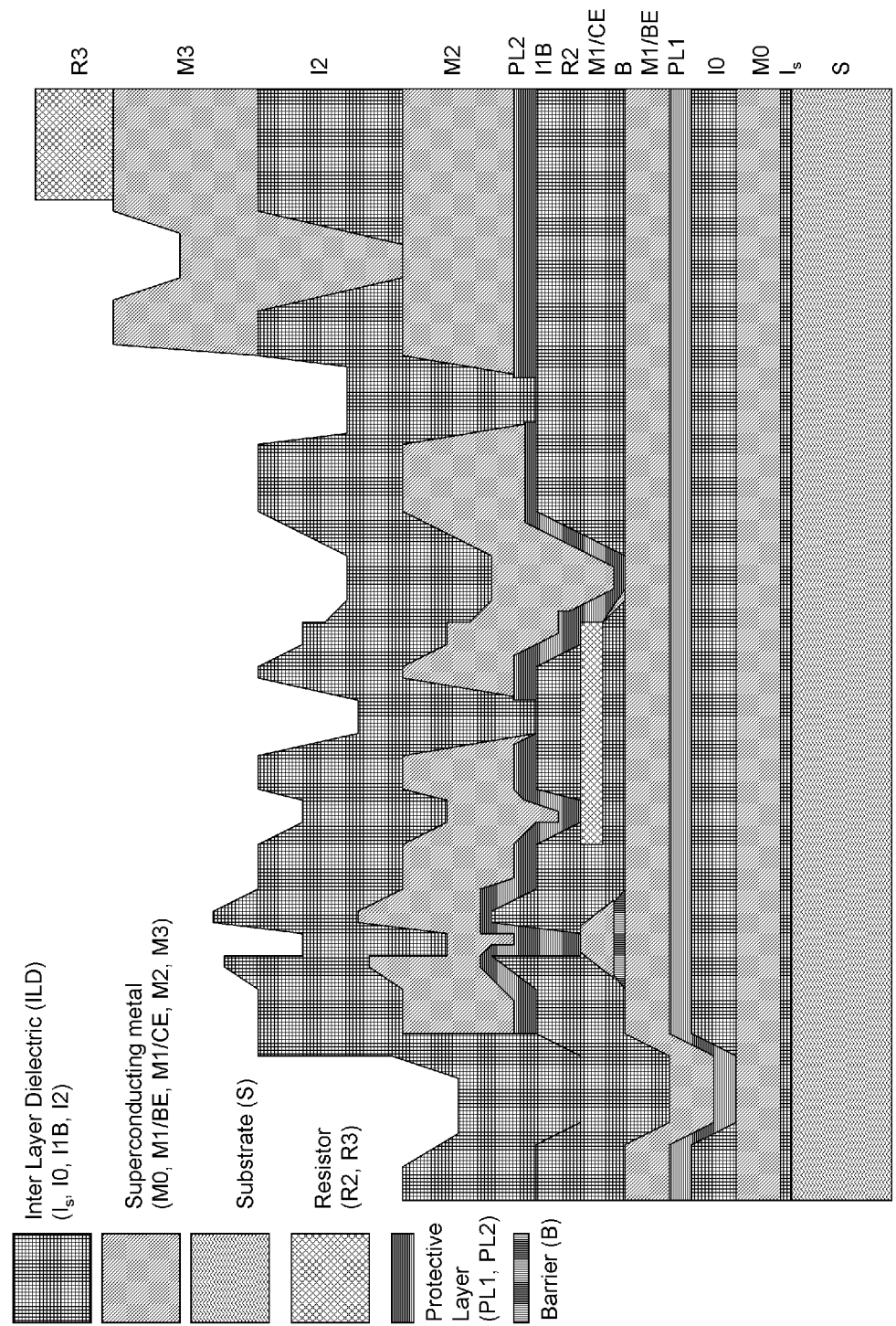
Figure 2C:
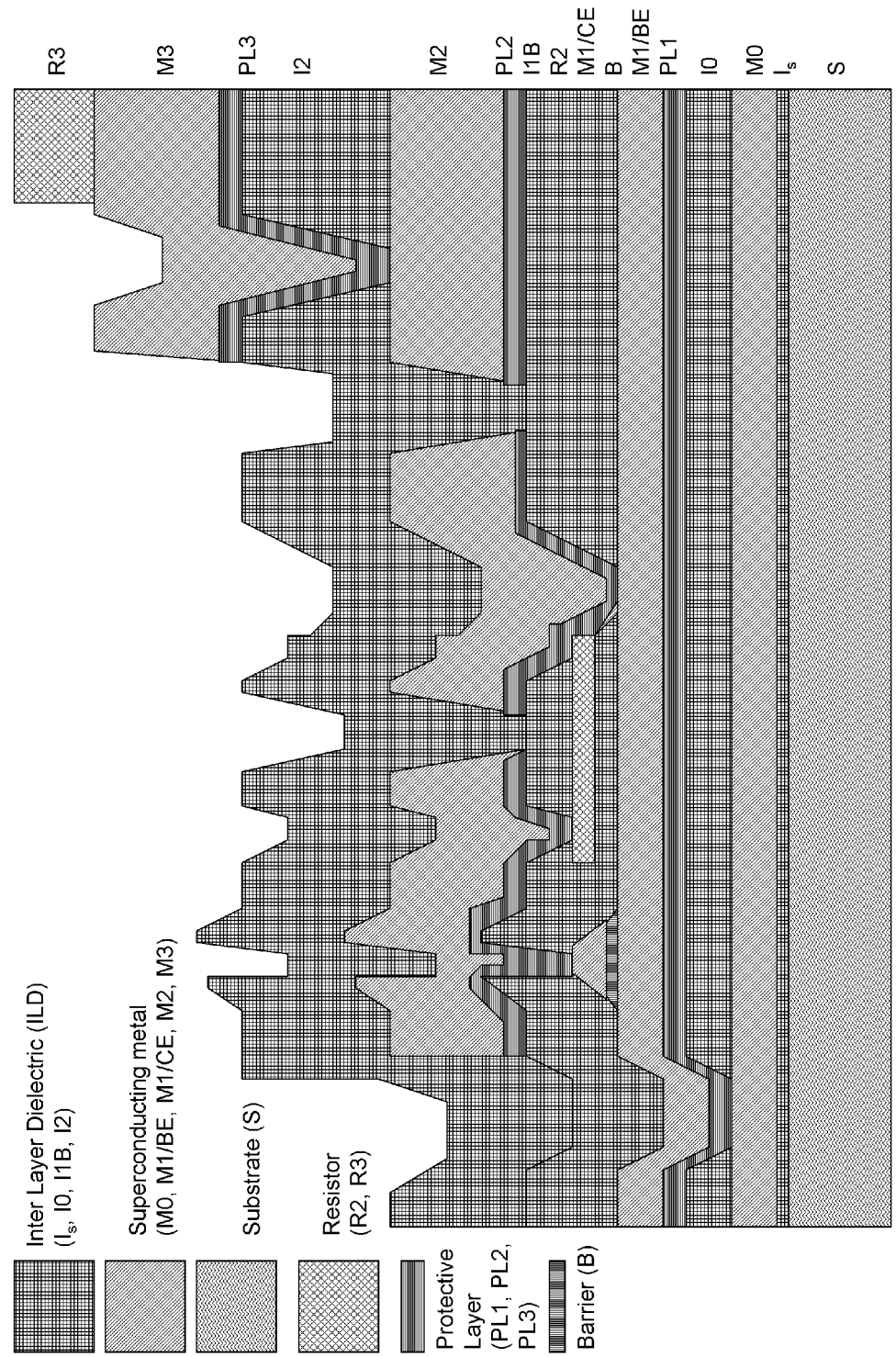
Figure 2D:
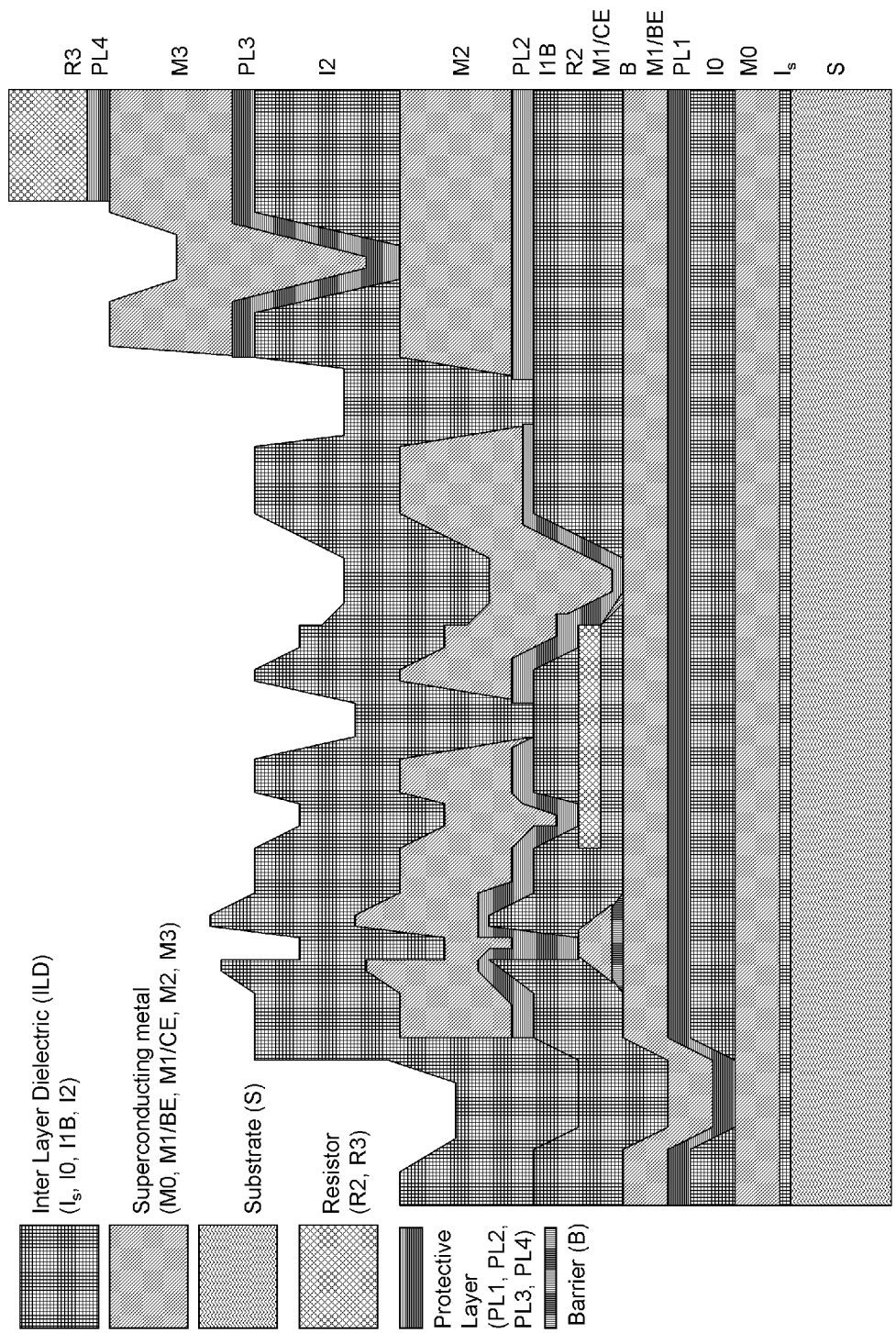

One preferred embodiment of the invention is obtained by modifying the standard Hypres IC process shown in FIG. 1 by including an extra Al layer on the Nb layers, as shown in FIGS. 2A-2D. This achieves, for example, a bilayer or trilayer conductor, which protects surrounding structures from the effects of e.g., hydrogen absorbed in the niobium, and may also provide a penta(hexa) layer Josephson junction with the niobium layers externally isolated. As noted above, the Josephson junction may inherently include an aluminum layer between the underlying niobium layer and the oxide; it is therefore possible to add a thin layer of aluminum over the oxide, to provide a generally symmetric structure. This added layer may require an additional etch step, and is not generally necessary; likewise, the intrinsic aluminum layer within the Josephson junction trilayer is typically insufficient to achieve the advantages according to aspects of the present technology. Note that the aluminum layer remaining after oxidation is thin, and may be sufficiently porous to permit diffusion of gasses such as hydrogen. Further, the known technique permits the aluminum layer only under the oxide, and therefore it serves no protective function from the overlayer.

A first embodiment of the method replaces a standard "trilayer" (Nb/Al/AlOx/Nb or Nb/Al/AlOx/Al/Nb) deposition over the wafer containing patterned wiring, interlayer insulator and/or resistor layers which are located below the Josephson junction layer (as dictated by circuit design and process layer sequence) by in-situ deposition of a "quadra-layer" M/Nb/Al/AlOx/Nb or M/Nb/Al/AlOx/Al/Nb, where M is a normal (nonmagnetic) or superconducting metal other than Nb. This extra metal layer works as, for example, a diffusion barrier (stop layer) for interlayer diffusion of impurities, a sink which absorbs impurities which diffuse to the boundary, and has a sufficiently high partition coefficient to selectively retain those impurities against further diffusion, or a reactive metal which coordinates with or bonds to the impurities and thus prevents further diffusion, in superconducting layers of integrated circuits. Since the most mobile impurity is hydrogen, this extra layer should preferably prevent interlayer diffusion of hydrogen through the metal layer to adjacent layer(s). This can be achieved if, on one hand, the M-layer has low solubility of hydrogen or low diffusion coefficient of hydrogen, or on the other hand, a very high solubility of, or chemical reactivity toward, hydrogen. On the other hand, this layer should preferably be compatible with the basic processes, not degrade superconducting properties of Nb layers in direct contact with this extra layer, and not degrade the critical current of the contact between two superconducting layers, not introduce additional mechanical stress, etc. In a particularly preferred implementation, the M-layer is an Al layer with thickness from 1 nm to ~10 nm. Al has lower solubility of hydrogen than Nb and lower diffusion coefficient. An additional benefit is that Al is a more pliable (plastic) material than Nb. Therefore, such an Al underlayer works also as a stress relief layer by reducing mechanical stress on the AlOx tunnel barrier of Josephson junctions. This stress reduction also helps to improve reproducibility and yield.

It is noted that the present technology may also be applied to superconducting electronic integrated circuits based on superconductivity of other materials than niobium metal, such as niobium nitride.

It is also preferred that the M-layer should have good adhesion to the interlayer dielectric and to superconducting layers (Nb).

Superconductivity in the M-layer is induced by the proximity effect, whereby a non-superconducting material becomes a superconductor by close proximity of a strongly superconducting material. (Note that although Al becomes superconducting below about 1K, these circuits are designed to operate at 4K, so that the Al layer is superconducting only by its strong contact with the Nb layer at the operating temperature.) This sets some restrictions on the possible choice of normal metals. They should preferably have long enough coherence length ($\sim \hbar V_f/k_B \pi T$), low mismatch of the Fermi velocity $V_f$ with Nb, etc. So, other possible implementations provide M=Mo, Re, Ti, Zr, Mg, and some other transition metals, for example Cu, Zn. Pd or other metals may be used to coordinate with hydrogen, and form a superconductive hydride.

The M-layer should also preferably be etch-compatible with superconducting electrodes (Nb) because it is preferably patterned along with patterning of the base electrode of Josephson junctions, in order to avoid additional mask steps.

Some superconducting alloys and compounds can also be used, e.g. superconducting nitrides or carbonitrides of Nb and Mo (NbN and MoN, NbCN, etc.), NbTi and NbZr alloys, NbTiN, $MgB_2$, etc.

The typical deposition of a wiring layer (Nb) according to the prior art over patterned Josephson junctions and resistors (over the interlayer dielectric with contacts and vias to the junctions, resistors, and other wiring layers below the junctions), may be modified with an in-situ deposition of a wiring bi-layer M/Nb, where M serves similar purposes as above and has similar target properties as indicated above. In the simplest implementation M is Al (1 nm to ~10 nm). This bi-layer is then patterned to form wiring between the junctions, resistors and other circuit elements in one or two etch steps using the same photoresist mask. This second diffusion barrier (diffusion stop-layer or protective layer) and stress relief layer now protects the counter electrode of the junctions from diffusion of impurities from wiring layers above the junction layer, and from extra stress induced by upper writing layers.

So in essence, any single superconducting layer may be replaced by in-situ deposited bi-layer M/Nb or by a tri-layer M'/Nb/M", and this may extend to each such layer.

Another aspect of the present invention is that it is compatible not only with a non-planarized fabrication process as shown in FIGS. 1 and 2A-2D, but also with a planarized process, described in further detail below.

Existing superconductor digital electronics manufacturing technology lacks a superconducting plug technology, particularly a technology that is compatible with next-generation planarized processes. In the current state-of-the art, contacts between wiring layers are made by etching contact holes in interlayer dielectric, and then depositing a superconducting layer over the patterned interlayer dielectric, e.g., as shown in FIGS. 3A-3B.

Figures 3A, 3B:
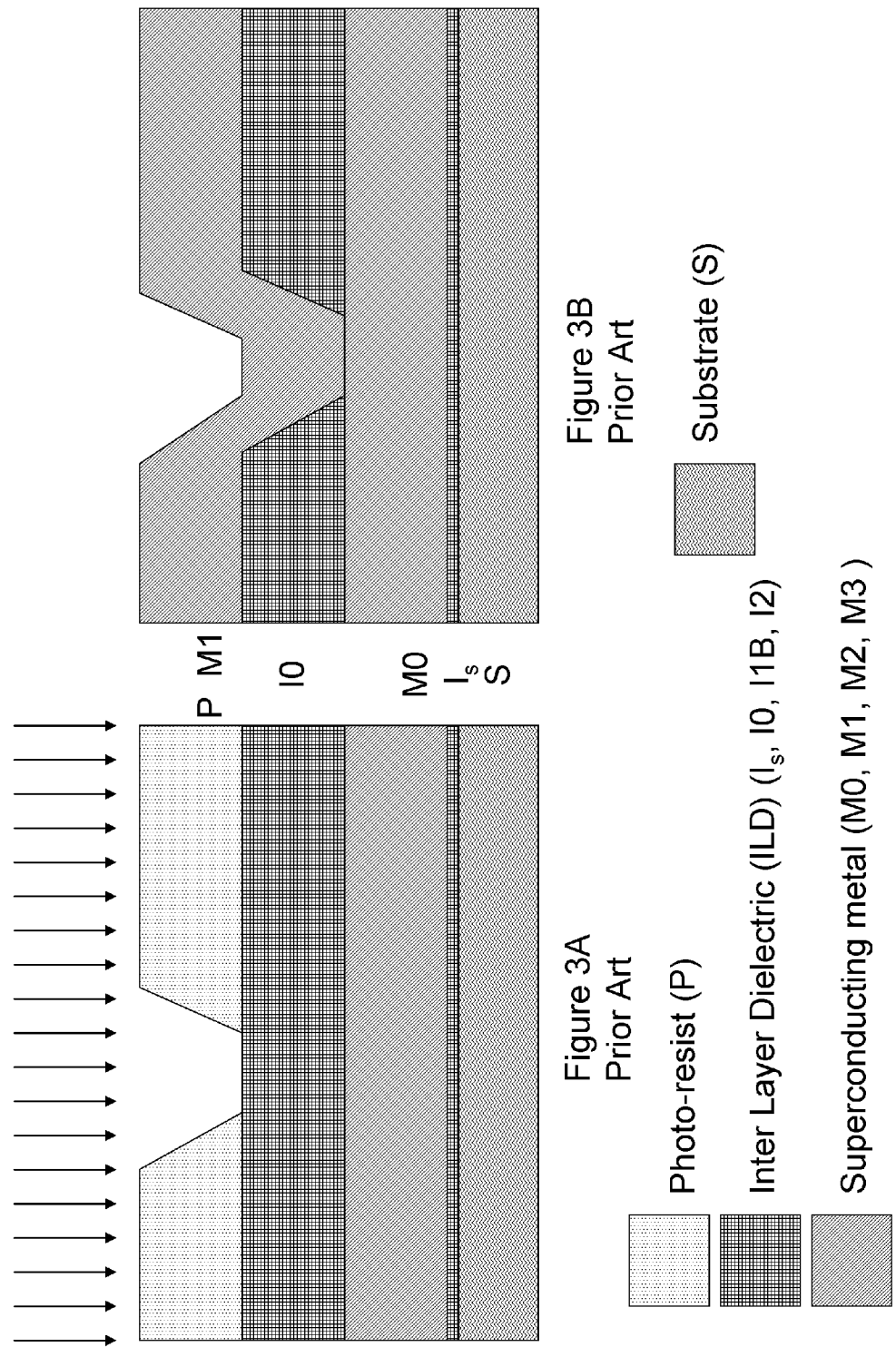
FIGS. 3A and 3B show steps of a process of making superconducting contacts between two superconducting layers according to the prior art.

FIGS. 3A to 3B show a prior art process of making superconducting contacts between two superconducting layers M0 and M1, consisting of the following steps:
- a) layer M0 deposition on a base layer of dielectric ($I_s$);
- b) layer M0 patterning (not shown);
- c) interlayer dielectric (ILD) (I0) deposition;
- d) Interlayer dielectric patterning consisting of lithography, etching, photoresist stripping (FIG. 3A); and
- e) layer M1 deposition over the patterned interlayer dielectric (FIG. 3B).

Since the contact should be able to carry significant superconducting current, the second wiring layer should cover the step in the interlayer dielectric. To improve step coverage, the contact hole is usually etched with sloped walls as shown in FIGS. 3A and 3B. This is achieved by creating a sloped photoresist profile and using photoresists which erode (etch) during etching of the ILD, such that the contact hole opening at the bottom of the resist increases as etching progresses. However, it becomes progressively more difficult to fill contact holes when their size becomes less than ~1 µm, and the critical current of such contacts usually diminishes. Contact holes also create an additional topography as the number of layers in the integrated circuit increases. This topography makes it difficult to perform photolithography due to the depth of focus limitations. It also increases the thickness of metal and dielectric layers deposited over the topography in order to cover the steps formed. This restricts the total number of layers in the unplanarized structure as well as restricts the usefulness of upper (thick) layers as circuit inductors.

Therefore, a planarized process with superconducting studs (plugs) between superconducting and resistive layers of superconductor integrated circuits is advantageous.

The superconducting contact between superconducting layers in integrated circuits is formed by the following method, shown schematically in FIGS. 4A to 4F. FIGS. 4A-4F show a process of superconducting plug formation between, e.g., layers M0 and M2 of the integrated circuit by using in-situ-deposited Josephson junction trilayer M1, which consists of M1/BE base electrode, barrier B, and M1/CE counter electrode, not shown in FIGS. 4A-4F. The same process can be used to form a superconducting contact between any pair of superconducting layers.

First, instead of a continuous metal layer (as in the prior art), a trilayer consisting of two superconducting layers separated by a stop layer is deposited in-situ over the wafer (M0, PL1 and M1 shown in FIG. 4A).

The thickness of the first layer M0 in the trilayer is equal to the desired thickness of the wiring layer M0, the thickness of the second superconducting layer M1 is equal to the desired thickness of the interlayer dielectric I0 (the height of the plug), and the stop layer thickness is much smaller than the thickness of the superconducting layers M0, M1. In the preferred implementation, superconductor layers are Nb layers with a thickness between 100 nm and 300 nm. The stop layer is a thin metal layer which may have a smaller etch rate than the superconducting layers under the etching conditions (etch chemistry and/or etch power) employed to etch the superconducting layers. In the preferred implementation, the etch stop layer is a thin Al layer with thickness in the range of 1-10 nm. Other possible stop layers in combination with Nb layers are thin layers of Mo, Ti, etc. In the preferred implementation, the etch stop layer also serves as a protective (diffusion stop) layer.

Second, the superconducting stud (plug) is formed by using photolithography to form an etch mask, and dry etching (RIE, ICP, etc.) used to remove the top superconducting layer of the trilayer in the areas not protected by the photoresist, as shown in FIG. 4A. The etching stops at the stop layer of the trilayer, as shown in FIG. 4B.

Third, the exposed stop layer may be removed using either a second dry etching (in a different chemistry or with different etch parameters), or Ar ion milling, or a wet etching, as shown in FIG. 4B. Alternately, the stop layer may be retained, for example to serve as a protective layer.

Fourth, a new lithographic step is performed to pattern the bottom layer M0 of the trilayer M0-PL1-M1, which should have the pattern corresponding to the design pattern of layer M0. The bottom layer is then etched using dry etching (RIE, ICP, etc.). The photoresist mask is then removed by stripping the photoresist chemically or by dry etching, as shown in FIGS. 4C-4D.

Fifth, the interlayer dielectric is deposited all over the wafer. Then, it is planarized by chemical mechanical polishing, as shown in FIG. 4E. The planarization process is stopped when the deposited dielectric has been removed (polished away) from tops of the plugs etched in the trilayer. A short dry etch step may follow, in order to remove the residue of the dielectric from the surface of plugs formed in the second step above. In the preferred implementation, the interlayer dielectric can be silicon dioxide $SiO_2$, silicon nitride ($SiN_x$), silicon oxinitride ($SiO_xN_y$), and amorphous or polycrystalline silicon.

Sixth, the superconducting layer M2 is deposited over the entire wafer, adhering to the surface of the planarized interlayer dielectric and clean surface of superconducting studs (plugs) M1 as shown in FIG. 4F.

For some applications of the process, e.g. for superconductive circuits for quantum computing, superconducting qubits, etc., it may be advantageous to keep the etch stop layer over the bottom superconducting layer, because the stop layer can be designed such that it also protects the top surface of the bottom layer from oxidation, reaction with process gases, atmospheric moisture, etc. and hence improve the performance of superconducting qubits by reducing losses of energy and decoherence of qubits caused by the surface of superconducting layers.

Figure 5A:
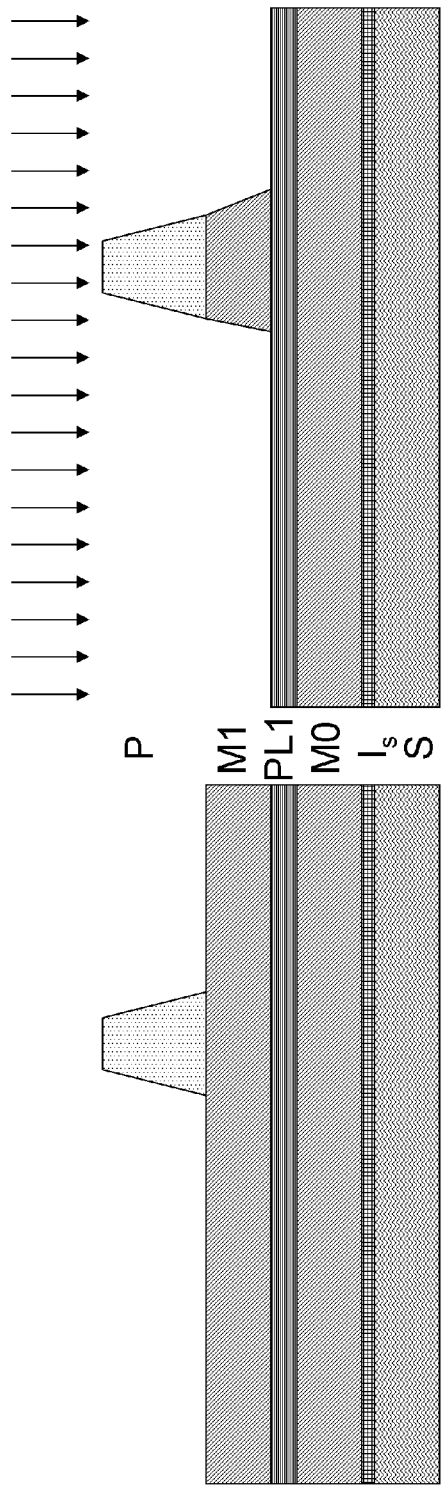
Figure 5B:
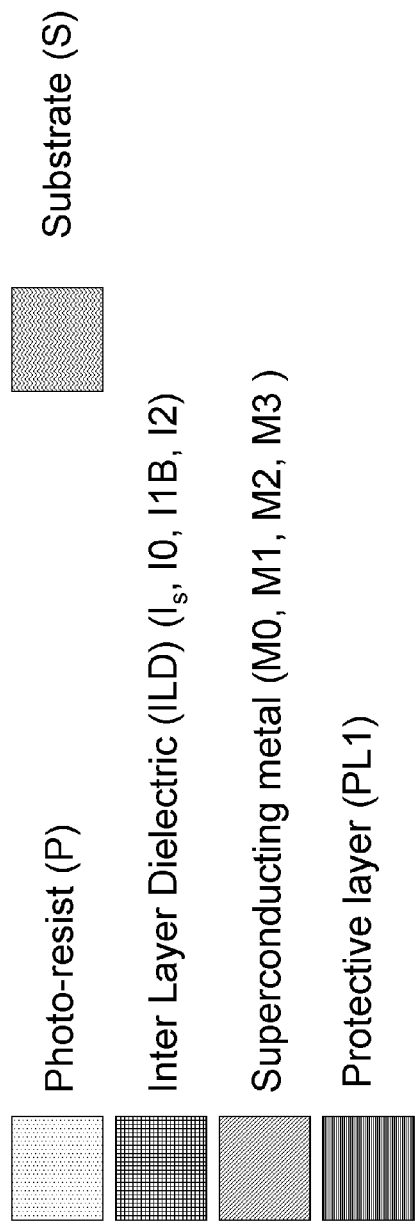

Another implementation of the process for superconducting plugs (studs) between two superconducting layers, e.g., M0 and M2 is shown in FIGS. 5A-5F. In this case the etch stop layer is left over the surface of layer M0, and works as a surface protection (surface modification) layer enhancing the performance of layer M0, e.g., at microwave frequencies. After the trilayer M0-PL1-M1 deposition, and optical (e-beam) lithography (FIG. 5A), the superconducting studs (plugs) are etched in the top layer M1 of the trilayer. Etching stops at the middle layer PL1 of the trilayer. The photoresist mask shown in FIG. 5B is then removed.

The second photoresist is spun-on, and the second photo- (or e-beam) lithography is performed to form an etch mask for the bottom layer M0 of the trilayer. The middle layer PL1 of the trilayer is then etched using either dry or wet etching, or Ar ion milling to expose the surface of the bottom layer M0 of the trilayer, as shown in FIG. 5C. The bottom layer is then etched using dry etching (RIE, ICP, etc.) as shown in FIG. 5D.

From this point on the process follows steps 5 and 6 described above, to form the planarized dielectric, and to deposit the next superconducting layer M2, as shown in FIGS. 5E and 5F.

Since the superconducting plugs in the I1B interlayer dielectric never overlap with the holes (moats) in the bottom superconducting layer M0, the patterning of the top M1 and bottom M0 layers of the trilayer can also be completely reversed, as shown in FIGS. 6A-6F.

Figures 6E, 6F:
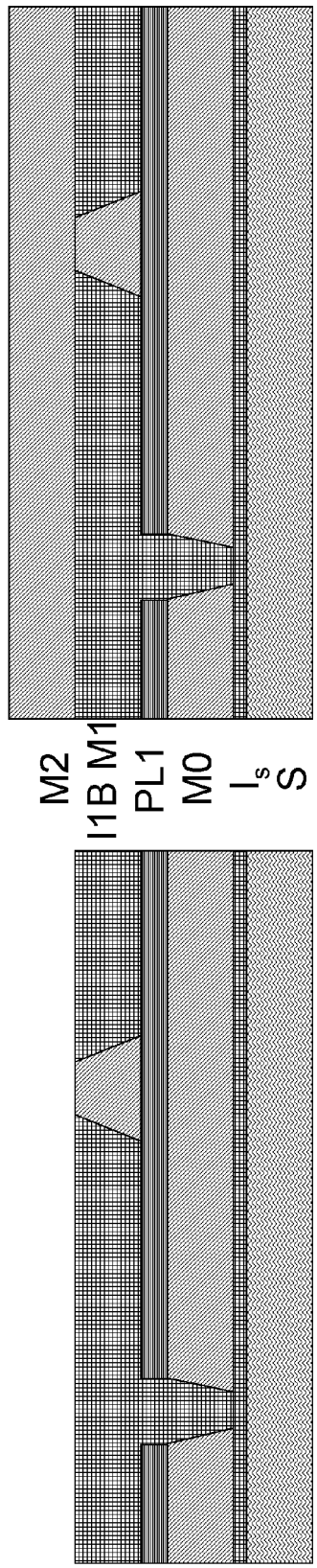

FIGS. 6A-6F shows an inverted process of forming superconducting plugs (studs) using a trilayer M0-PL1-M1. In this case, the first photoresist mask applied corresponds to the pattern required for bottom layer M0, as shown in FIGS. 6A-6B. The etch stop layer PL1 is removed by dry or wet etching, or by ion milling. After etching the top layer M1 of the trilayer, the photoresist is stripped and the second photoresist mask is applied corresponding to the pattern required for superconducting plugs M1, as shown in FIG. 6C. The second dry etching follows, to remove all metal layers M1, M0 which are not protected by the second photoresist mask or etch stop layer (the bottom layer M0 and the top layer M1 of the trilayer are being etched here simultaneously). The etching stops on the middle layer PL1 of the trilayer, which works as an etch stop, as shown in FIG. 6D. IDL I1B deposition and planarization is then performed, as shown in FIG. 6E, followed by deposition of the next superconducting layer M2, as shown in FIG. 6F.

The process can be easily extended if more superconducting wiring layers are required. In this case, instead of a single superconducting layer M2 as above, as shown in FIG. 6F, a second superconducting trilayer M2-PL2-M3 is deposited in-situ all over the wafer, as shown in FIG. 7A. Their functions are exactly the same as in the first trilayer M0-PL1-M1. The thickness of M2 layer is equal to the desired thickness of the second wiring layer (in the range from ~100 nm to ~300 nm), the thickness of the top layer M3 is equal to the required thickness of the second interlayer dielectric I2. The middle layer PL2 is a thin layer (1-10 nm) serving as an etch stop layer and surface protective layer for the second wiring layer M2.

The patterning of the top M3, middle PL2, and bottom M2 layers of the second trilayer M2-PL2-M3 is performed analogously to the pattering of the trilayer M0-PL1-M1.

Figure 7C:
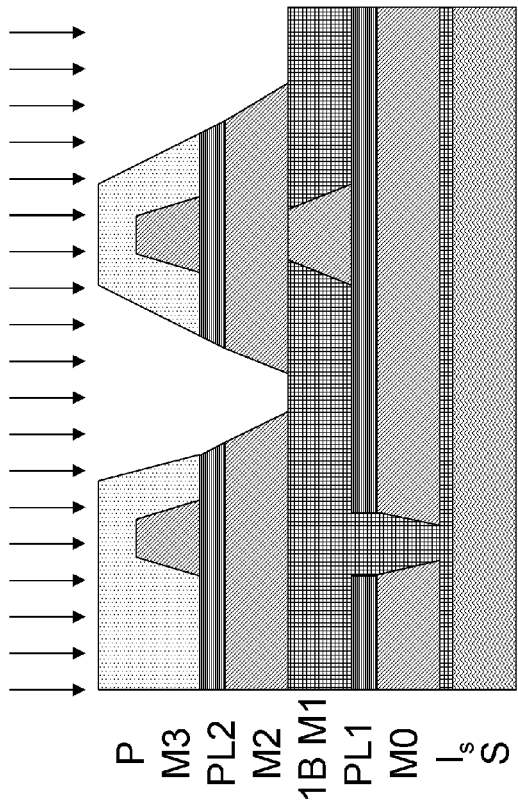
Figure 7C:
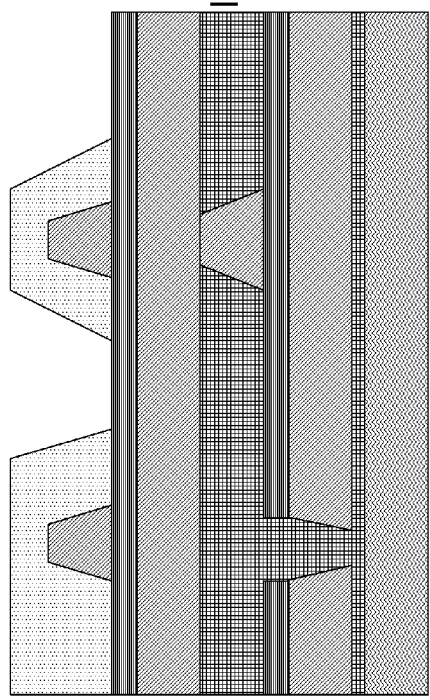
Figure 7D:
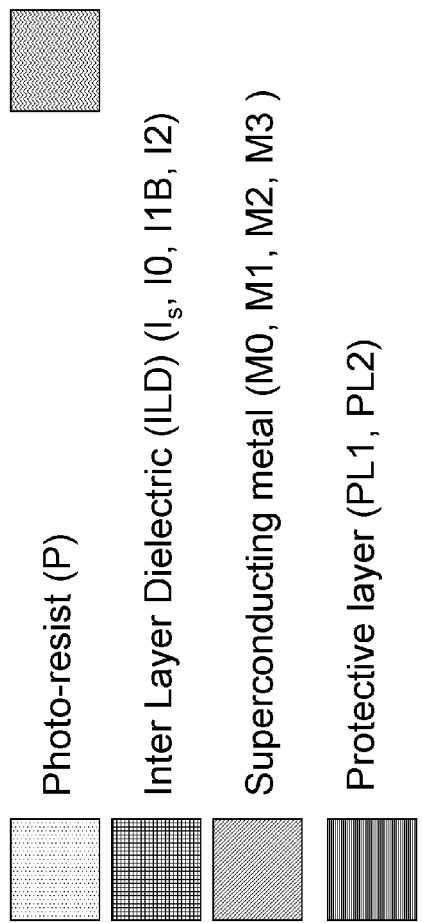

After stripping the resist shown in FIG. 7A, the top layer M3 of the trilayer is etched and the resist P removed, as shown in FIG. 7B. A further resist layer P is deposited and patterne3d, as shown in FIG. 7C, and etching performed through the lower portion M2 of the trilayer as shown in FIG. 7D. The resist P is then removed, as shown in FIG. 7E. A second interlayer dielectric I2 is deposited over the wafer as shown in FIG. 7F. The dielectric I2 is planarized by using chemical mechanical polishing, as shown in FIG. 7G. Then, a third trilayer M4-PL3-M5 may be deposited over the planarized surface as shown in FIG. 7H.

The same processing continues until all superconducting layers and contacts (plugs) between them are formed.

It can be seen from FIGS. 4-7 that each of the superconducting plugs formed by the proposed method contains one etch stop layer (the middle layer of the deposited trilayers). It is convenient to choose a material for the etch stop layers such that it also prevents diffusion of impurities between adjacent superconducting layers, that is, it also works at a diffusion stop layer. In this case, the diffusion of impurities between superconducting layers, which can only occur through contacts (plugs) between them, will be greatly reduced. In the preferred implementation, migrating impurities are mainly hydrogen and oxygen which can be absorbed by Nb layers during wafer processing or storage due to reaction with air and moisture. A thin aluminum layer (from ~1 to 10 nm) can significantly impede diffusion of hydrogen and oxygen, and at the same time is an excellent etch stop layer for etching in fluorine-based chemistries used for etching Nb layers of superconductor integrated circuits. A molybdenum layer (~1 nm to ~5 nm) is another option. A magnesium (Mg) thin film (~1 nm to 10 nm) will work as well.

Al has extremely low solubility of hydrogen, ~6×10$^{-6}$ at. % at room temperatures. Hydrogen diffusivity in Al at room temperatures can vary by a few orders of magnitude according to different data, being in the range from $10^{-10}$ cm$^2$/s to $10^{-7}$ cm$^2$/s [22]-[24]. Even in the worst case, it is at least two orders of magnitude lower than in Nb. Combined with the extremely low solubility, this makes Al a very efficient diffusion barrier for hydrogen.

A 10-50 nm thick Ti layer, which acts as a getter (hydrogen extraction layer), may be provided which is placed such that the critical current of all contacts between superconducting layers is not reduced due to the presence of this non-superconducting (at the temperature of circuit operation) layer. This can be done by a lift off process when Ti is removed from the places of the future contact holes between the layer, or by etching Ti in these contact holes. In some cases, a thin layer of Ti may remain on the surface of a superconductor, and itself be induced into a superconductive state by proximity, and therefore under these circumstances, removal is not necessary.

The processes described above are designed primarily for superconductor integrated circuits based on Rapid Single Flux Quantum (RSFQ) logic. A new class of applications relates to Quantum Computing, whereby the Josephson junctions are formed into "qubits", and it is essential to minimize qubit decoherence associated with surface and volume defects. The multilayer approaches described herein can easily be extended to provide improved performance for quantum computing. For qubit applications, one can add extra layers that may comprise layers of insulators with low dielectric loss. Their purpose it to protect the surfaces of the main superconductor comprising the qubits (e.g., Nb) from forming lossy oxides and from absorbing gases, etc. which induce surface loss in qubits. The layers may also be formed of metals (superconducting and nonsuperconducting) with lower surface loss or lower reactivity with atmosphere, moisture, and processing chemicals (e.g., Al, Mo, Re, W, Zr, Au, etc.). Again, these over-layers or under-layers are deposited in-situ with the layer they serve to protect and are typically patterned together therewith.

Superconducting qubits typically comprise superconducting loops interrupted by one or more Josephson junctions. From an electrical point of view they represent nonlinear thin-film microwave LC resonators in which the resonating inductance and capacitance include, respectively, the nonlinear inductances of Josephson junctions and junction capacitance. The typical resonant frequency in the present state-of-the-art is from ~1 GHz to 20 GHz.

To operate as qubits, these superconducting circuits must have long coherence times, which are characterized by the energy relaxation time and the dephasing time. The dephasing time characterizes the time interval during which the phase coherence between two quantum states is lost. In general, the relaxation is determined by energy dissipation in the qubit circuit, which for superconducting qubits occurs primarily on the surfaces of superconducting layers forming the circuit, inside the tunnel barrier, in the interlayer dielectrics, and at the interfaces between superconducting and dielectric layers. The surface and the interfaces are the most significant source of energy dissipation due to the possibility of creating nonsuperconducting (or weakly superconducting) oxides and contaminated layers due to reaction between the surfaces of superconducting layers with air and processing chemical, or with interlayer dielectrics during the manufacturing of the quantum circuits.

The surfaces are also believed to be the main source of phase decoherence due to localized electronic states and magnetic moments (in the surface oxides and absorbed layers) which cause charge and flux noise (fluctuations) affecting the qubit performance.

Single superconducting layers are used in the prior art for wiring and interconnects. According to one aspect of the technology, one or more, and preferably all, superconducting layers are replaced by a multilayer so the various surfaces of the superconducting layers are protected during the fabrication. The extra surface layers should be made of thin superconducting or induced superconducting layers which serve to protect the superconducting layers from the adverse effects of contaminants or to serve as etch stop layers. The process is shown in FIGS. 8A-8J is similar to the process described in FIGS. 7A-7H, except that all free layer surfaces are protected by a layer of a metal such as Al, or Mo, or Re.

In the process of FIGS. 8A to 8J, the Josephson junction trilayer M1/BE-B-M1/CE is deposited as a penta-layer, with an additional protective layer on the top and bottom, which is preferably superconductive or induced-superconductive at integrated circuit operating temperatures. The wiring layers are deposited, not as a single layer, but as a trilayer, with the protective layer on the top and the bottom. This sequence is compatible with either a planarized (FIGS. 8A-8G) or non-planarized process (FIGS. 8A-8E and FIGS. 8H-8J).

FIG. 8A shows in-situ deposition of a penta-layer PL1-M1/BE-B-M1/CE-PL2 M/Nb/Al/AlOx/Nb/M, where M=Al, Mo, Re, etc. FIG. 8B shows Photolithography for patterning the Base Electrode M1/BE, formed of niobium. FIG. 8C shows etching of the top portion of the pentalayer, starting with the top protective layer PL2; etching of the Nb counter electrode M1/CE; and etching of Al/AlOx barrier B (or Al/AlOx/Al barrier) to leave a portion of the barrier B, such as the bottom non-oxidized aluminum metal portion only. FIG. 8D shows photolithography for patterning the M1/CE, defining Josephson junctions. FIG. 8E shows etching of the top layer of the pentalayer, in which the niobium M1/CE and M1/BE are etched simultaneously. FIG. 8F shows a thick blanket interlayer dielectric I1B deposition. FIG. 8G shows planarization of the thick blanket interlayer dielectric I1B, which stops at the protective layer PL2, using CMP.

FIG. 8H shows an alternate to FIG. 8G, with a thin interlayer dielectric I1B' deposition for a non-planarized process. FIG. 8I shows photolithography and contact hole etching proceeding from the structures shown in FIG. 8H. FIG. 8J shows deposition of a wiring trilayer PL4-M2-PL3 on the structures shown in FIG. 8I. Therefore, each niobium layer is bounded on top and bottom by a thin conductive metal layer which achieves superconductivity at 4.2K based on its proximity to the niobium metal layer, which may, for example, serve as a diffusion barrier, etch stop layer, as well as other purposes.

The minimum thickness of protective layers was determined by observing the reduction in pattern-dependent effects in $J_c$ of JJs with various connections to circuit layers. For Al it was found to be ~3 nm and ~5 nm for Mo. The maximum thickness is determined by the desired level of the critical current of Nb/PL/Nb contacts. We set this level at ~30 mA for circular contacts of 2-µm diameter. This gave ~10 nm upper limited for Al protective later thickness and less for Mo. From these considerations, a preferred thickness is ≈5 nm for both materials.

The best results were obtained with aluminum protective layers which eliminated effects of BE connection to M0 layer studied in [1]-[3] and effects of CE to Ti/Au contact pad connections studied in [4]-[6], [15]. With molybdenum protective layers, a substantial reduction in the value of the second effect was noted, but it was not completely eliminated, apparently due to a higher diffusivity and solubility of H in molybdenum than in aluminum.

Each protective layer was patterned along with the Nb layer underneath it, using the same photoresist mask (otherwise it would short the circuit). Aluminum protective layers were either etched in tetramethylammonium hydroxide solution in deionized water or dry etched in $Cl_2/BCl_3$ mixture, or Ar ion milled. No difference was found in the results. Molybdenum protective layers were dry etched in $SF_6$ plasma in-situ right after Nb etching.

Diffusion stop-layers (DSLs) formed between contacting Nb layers prevent interlayer migration of impurities and reduce their effect on tunnel barrier. These DSLs were deposited in-situ along with Nb Josephson junctions and wiring layers. Elimination of circuit pattern-dependent and contacting-layer-dependent effects on $J_c$ of JJ was generally achieved using this technology.

REFERENCES

Incorporated Herein by Reference

[1] S. K. Tolpygo, D. Amparo, A. Kirichenko, and D. Yohannes, "Plasma process-induced damage to Josephson tunnel junctions in superconducting integrated circuits," Supercond. Sci. Technol., vol. 20, pp. S341-S349, November 2007.

[2] S. K. Tolpygo and D. Amparo, "Fabrication process development for superconducting VLSI circuits: Minimizing plasma charging damage," J. Phys. Conf. Ser., vol. 97, p. 012227, 2008.

[3] S. K. Tolpygo, D. Amparo, D. T. Yohannes, M. Meckbach, and A. F. Kirichenko, "Process-induced variability of Nb/Al/AlOx/Nb junctions in superconductor integrated circuits and protection against it," IEEE Trans. Appl. Supercond., vol. 19, pp. 135-139, June 2009.

[4] S. K. Tolpygo and D. Amparo, "Fabrication process-induced variations of Nb/Al/AlOx/Nb Josephson junctions in superconductor integrated circuits," Supercond. Sci. Technol., vol. 23, p. 034024 (pp. 9), February 2010.

[5] K. Hinode, T. Satoh, S. Nagasawa, and M. Hidaka, "Hydrogen-inclusion-induced variation of critical current in Nb—AlOx—Nb Josephson junctions," J. Appl. Phys., vol. 104, p. 023909, 2008.

[6] K. Hinode, T. Satoh, S. Nagasawa, and M. Hidaka, "Origin of hydrogen-inclusion-induced critical current deviation in Nb/Al/AlOx/Nb Josephson junctions," J. Appl. Phys., vol. 107, pp. 073906, 2010.

[7] Y. Fukai and H. Sugimoto, "Diffusion of hydrogen in metals," Adv. Phys., vol. 34, pp. 263-326, 1985.

[8] M. A. Pick, A. Hanson, K. W. Jones, and A. N. Goland, "Depth-concentration profile of hydrogen in niobium," Phys. Rev. B, vol. 26, pp. 2900-2906, 1982.

[9] A. Pundt and R. Kirchheim, "Hydrogen in metals: Microstructural aspects," Annu. Rev. Mater. Res., vol. 36, pp. 555-608, 2006.

[10] D. I. Hagen and E. E. Donaldson, "Interaction of hydrogen with a (100) niobium surface," Surf. Sci., vol. 45, pp. 61-76, 1974.

[11] R. J. Smith, "Photoemission studies of hydrogen chemisorption on Nb," Phys. Rev. B, vol. 21, pp. 3131-3136, 1980.

[12] S. K. Tolpygo and D. Amparo, "Electric stress effect on Josephson tunneling through ultrathin AlOx barrier in Nb/Al/AlOx/Nb junctions," J. Appl. Phys., vol. 104, pp. 063904-1-063904-10, 2008.

[13] D. Amparo and S. K. Tolpygo, "Effect of electrical stress on Josephson tunneling characteristics of Nb/Al/AlOx/Nb junctions," IEEE Trans. Appl. Supercond., vol. 19, pp. 154-158, June 2009.

[14] E. Cimpoiasu, S. K. Tolpygo, X. Liu, N. Simonian, J. E. Lukens, and K. K. Likharev, "Aluminum oxide layers as possible components for layered tunnel barriers," J. Appl. Phys., vol. 96, pp. 1088-1093, July 2004.

[15] D. Amparo and S. K. Tolpygo, "Investigation of the role of H in fabrication-process-induced variations of Nb/Al/AlOx/Nb Josephson junctions," IEEE Trans. Appl. Supercond., to be published, ASC2010 paper 1EPB-02.

[16] S. K. Tolpygo, D. Yohannes, R. T. Hunt, J. A. Vivalda, D. Donnelly, D. Amparo, and A. Kirichenko, "20 kA/cm2 process development for superconductor integrated circuits with 80 GHz clock frequency," IEEE Trans. Appl. Supercond., vol. 17, pp. 946-951, June 2007.

[17] HYPRES Nb Process Design Rules (30-1000-4500 A/cm2), Process #03-10-45. HYPRES, Inc., Elmsford, N.Y. 10523. Available: www.hypres.com/pages/download/designrules/DesignRules.pdf

[18] C. H. Seager, R. A. Anderson, and J. K. G. Panitz, "The diffusion of hydrogen in silicon and mechanisms for "unintentional" hydrogenation during ion beam processing," J. Mater. Res., vol. 2, pp. 96-106, January/February 1987.

[19] X. C. Mu, S. J. Fonash, and R. Singh, "Observation of boron acceptor neutralization in silicon produced by CF4 reactive ion etching or Ar ion beam etching," Appl. Phys. Lett., vol. 49, pp. 67-69, July 1986.

[20] W. Chen, V. Patel, S. K. Tolpygo, and J. E. Lukens, "Development toward high-speed integrated circuits and SQUID qubits with Nb/AlOx/Nb Josephson junctions" IEEE Trans. Appl. Supercond. vol. 13, pp. 103-106, June 2003.

[21] G. L. Kerber, L. A. Abelson, K. Edwards, R. Hu, M. W. Johnson, M. L. Leung, and J. Luine, "Fabrication of high current density Nb integrated circuits using a self-aligned junction anodization process," IEEE Trans. Appl. Supercond., vol. 13, pp. 82-86, June 2003.

[22] T. Ishikawa and R. B. McLellan, "The diffusivity of hydrogen in aluminum," Acta Metallurgica, vol. 34, pp. 1091-1095, 1986.

[23] G. A. Young and J. R. Scully, "The diffusion and trapping of hydrogen in high purity aluminum," Acta Mater., vol. 46, pp. 6337-6349, 1998.

[24] E Hashimoto and T. Kino, "Hydrogen diffusion in aluminum at high temperatures," J. Phys. F: Metal Phys., vol. 13, pp. 1157-1165 (1983).

[25] S. K. Tolpygo, D. Amparo, R. T. Hunt, J. A. Vivalda, and D. Yohannes, "Diffusion stop-layers for superconducting integrated circuits and qubits with Nb-based Josephson junctions," IEEE Trans. Appl. Supercond. (ASC 2010 to be published (1EPB01)), 2011.

[26] S. K. Tolpygo and D. Amparo, "Electrical stress effect on Josephson tunneling through ultrathin AlOx barrier in Nb/Al/AlOx/Nb junctions," J. Appl. Phys., vol. 104, pp. 063 904+, September 2008.

[27] G. Alefeld and J. Volkl, Eds., Hydrogen in Metals I, II. Berlin: Springer, 1978.

[28] G. Bauer, "Lattice distortions due to deuterium in niobium," Solid State Commun., vol. 17, no. 2, pp. 161-165, July 1975.

[29] S. Isagawa, "Influence of hydrogen on superconducting niobium cavities," J. Appl. Phys., vol. 51, no. 11, pp. 6010-6017, 1980.

[30] D. Hagen and E. Donaldson, "Interaction of hydrogen with a (100) niobium surface," Surf. Sci., vol. 45, no. 1, pp. 61-76, September 1974.

[31] Y. Li, J. L. Erskine, and A. C. Diebold, "High-resolution electron-energy-loss spectroscopy of hydrogen chemisorption at Nb(100) surfaces: Evidence for subsurface absorption sites," Phys. Rev. B, vol. 34, no. 8, pp. 5951-5954, October 1986.

[32] K. Hinode, T. Satoh, S. Nagasawa, and M. Hidaka, "Hydrogen-inclusion-induced critical current deviation of Nb/AlOx/Nb Josephson junctions in superconducting integrated circuits," IEEE Trans. Appl. Supercond., vol. 19, no. 3, pp. 131-134, June 2009.

[33] M. Gurvitch, M. A. Washington, and H. A. Huggins, "High quality refractory Josephson tunnel junctions utilizing thin aluminum layers," Appl. Phys. Lett., vol. 42, no. 5, pp. 472-474, 1983.

[34] J. Engelhard, "The diffusion of H and D in Nb and Ta at low temperatures," J. Phys. F, vol. 9, no. 11, pp. 2217-2229, 1979.

[35] G. Schaumann, J. Volkl, and G. Alefeld, "Relaxation process due to long-range diffusion of hydrogen and deuterium in niobium," Phys. Rev. Lett., vol. 21, no. 13, pp. 891-893, September 1968.

What is claimed is:

1. A superconducting integrated circuit, comprising:
a first superconducting layer formed into a superconducting device, subject to alteration in superconducting device properties caused by at least hydrogen diffusion;
a second superconducting layer having hydrogen diffused therein, providing a superconducting electronic path for communication with the first superconducting layer; and
a diffusion barrier layer interposed between the first and second superconducting layers, formed from a composition which is superconductive or induced into superconductivity by proximity to the first and second superconducting layers, to thereby complete a non-switching superconducting path between the first and second superconducting layers, and which substantially blocks diffusion of hydrogen from the second superconducting layer to the first superconducting layer at temperatures below about 290K, such that the superconducting properties of the first superconducting layer remain stable after fabrication and storage at or below 290K, wherein the diffusion barrier layer is patterned together with the first superconducting layer in a common photolithographic mask step.

2. The superconducting integrated circuit according to claim 1, wherein the diffusion barrier layer interposed between the first and second superconducting layers substantially blocks diffusion of hydrogen from the second superconducting layer to the first superconducting layer at temperatures below about 350K.

3. The superconducting integrated circuit according to claim 1, wherein the diffusion barrier layer is formed of a material having at least one chemical characteristic, selected from the group consisting of etch susceptibility, diffusion coefficient, affinity, permeability, solubility, and reactivity for a diffusible composition, which is different from each of the first and second superconducting layers.

4. The superconducting integrated circuit according to claim 1, wherein the first superconducting layer, second superconducting layer, and diffusion barrier layer have superconducting critical temperatures below 50K.

5. The superconducting integrated circuit according to claim 1, wherein the diffusion barrier layer absorbs hydrogen to reduce net transport of hydrogen from the second superconducting layer to the first superconducting layer.

6. The superconducting integrated circuit according to claim 1, wherein the diffusion barrier layer reacts with hydrogen to reduce net transport of hydrogen from the second superconducting layer to the first superconducting layer.

7. The superconducting integrated circuit according to claim 1, wherein the diffusion barrier layer further acts as an etch stop layer to protect the first superconducting layer during etching of other structures.

8. The superconducting integrated circuit according to claim 1, wherein the first superconducting layer is configured as part of a Josephson junction trilayer comprising a hydrogen-sensitive barrier layer.

9. A method of forming a superconducting integrated circuit, comprising:
    providing a first superconducting layer formed into a Josephson junction superconducting device, subject to alteration in switching properties caused by diffusion of hydrogen;
    depositing a diffusion barrier layer over the first superconducting layers, formed from a composition which is superconductive or induced into superconductivity by proximity to the first superconducting layer, to form a non-switching superconducting path communicating with the first superconducting layer, and which substantially blocks diffusion of hydrogen toward the first superconducting layer at temperatures below about 290K, such that the superconducting properties of the Josephson junction superconducting device stable after fabrication and storage at or below 290K;
    patterning the diffusion barrier layer together with the first superconducting layer in a common photolithographic mask step; and
    forming a second superconducting layer over the patterned diffusion layer to provide a superconducting electronic path for communication with the first superconducting layer.

10. The method according to claim 9, further comprising etching the second superconducting layer using the diffusion barrier layer as an etch stop, wherein the etching generates at least one of hydrogen and oxygen in the second superconducting layer.

11. The method according to claim 9, wherein the diffusion barrier layer interposed between the first and second superconducting layers substantially blocks diffusion of oxygen from the second superconducting layer to the first superconducting layer at temperatures below about 350K.

12. The method according to claim 9, wherein the diffusion barrier layer is formed of a material having at least one chemical characteristic, selected from the group consisting of etch susceptibility, diffusion coefficient, affinity, permeability, solubility, and reactivity for a diffusible composition, which is different from each of the first and second superconducting layers.

13. The method according to claim 1, wherein the first superconducting layer, second superconducting layer, and diffusion barrier layer have superconducting critical temperatures below 50K, further comprising operating the Josephson junction superconducting device at a temperature below 50K.

14. The method according to claim 1, wherein the first superconducting layer forms a Josephson junction trilayer of a quantum computing element, the diffusion barrier layer comprising a metal layer adjacent to the Josephson junction trilayer displaying induced superconductivity at an operating temperature of the Josephson junction trilayer and a lower permeability for hydrogen than the first superconducting layer, further comprising conducting at least one quantum computing operation with the quantum computing element.

15. A method of forming a superconducting integrated circuit, comprising:
    depositing a Josephson junction trilayer;
    depositing a diffusion barrier layer on an upper superconducting surface of the Josephson junction trilayer, the diffusion barrier layer comprising a material that is superconductive or subject to induced superconductivity substantially without switching at operating conditions of the Josephson junction trilayer;
    patterning the diffusion barrier layer together with at least the upper superconducting surface of the Josephson junction trilayer;
    depositing a second superconducting layer on at least the patterned diffusion barrier layer, to form a superconducting path between the first superconducting layer and the second superconducting layer through the diffusion barrier layer, while substantially impeding diffusion of at least hydrogen from the second superconducting layer to the first superconducting layer through the diffusion barrier layer at least at temperatures below about 290K.

16. The method according to claim 15, further comprising planarizing the superconducting integrated circuit after said patterning.

17. The method according to claim 15, wherein the diffusion barrier layer relieves a stress in at least one of the first and second superconducting layers.

18. The method according to claim 15, further comprising absorbing of impurities from at least one of the first superconducting layer and the second superconducting layer with the diffusion barrier layer.

19. The method according to claim 15, wherein the diffusion barrier layer acts comprises an etch stop layer for patterning of the second superconducting layer.

20. The method according to claim 15, wherein the diffusion barrier layer is effective to maintain a stability of Josephson junction trilayer switching properties against an effect of hydrogen diffusion from the second superconducting layer to the first superconducting layer when the superconducting integrated circuit is at least maintained below about 290K.

* * * * *